(12) United States Patent
Noborio et al.

(10) Patent No.: US 10,964,809 B2
(45) Date of Patent: Mar. 30, 2021

(54) SEMICONDUCTOR DEVICE AND MANUFACTURING PROCESS THEREFOR

(71) Applicant: DENSO CORPORATION, Kariya (JP)

(72) Inventors: Masato Noborio, Kariya (JP); Masayasu Ishiko, Nagakute (JP); Jun Saito, Toyota (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/816,463

(22) Filed: Mar. 12, 2020

(65) Prior Publication Data

US 2020/0227549 A1 Jul. 16, 2020

Related U.S. Application Data

(63) Continuation of application No. PCT/JP2018/034065, filed on Sep. 13, 2018.

(30) Foreign Application Priority Data

Sep. 14, 2017 (JP) .............................. JP2017-176776

(51) Int. Cl.
*H01L 29/78* (2006.01)
*H01L 21/265* (2006.01)
(Continued)

(52) U.S. Cl.
CPC .... *H01L 29/7813* (2013.01); *H01L 21/26513* (2013.01); *H01L 29/0619* (2013.01); *H01L 29/0696* (2013.01); *H01L 29/0865* (2013.01); *H01L 29/1608* (2013.01); *H01L 29/41741* (2013.01); *H01L 29/4236* (2013.01); *H01L 29/66068* (2013.01); *H01L 29/66734* (2013.01); *H01L 29/7811* (2013.01)

(58) Field of Classification Search
None
See application file for complete search history.

(56) References Cited

U.S. PATENT DOCUMENTS

2007/0272979 A1    11/2007   Saito et al.
2010/0200936 A1    8/2010    Saito et al.
(Continued)

FOREIGN PATENT DOCUMENTS

| EP | 3 012 870 A1 | 4/2016 |
|---|---|---|
| JP | 2014-170778 A | 9/2014 |
| JP | 2015-076592 A | 4/2015 |

*Primary Examiner* — Thien F Tran
(74) *Attorney, Agent, or Firm* — Posz Law Group, PLC

(57) ABSTRACT

A semiconductor device comprises: a cell region that includes a semiconductor element; an outer peripheral region that surrounds an outer periphery of the cell region; a substrate that has a front surface and a back surface, and is made of a semiconductor of a first or second conductivity type; a first conductivity layer that is formed on the front surface of the substrate and made of the semiconductor of the first conductivity type having a lower impurity concentration than impurity concentration of the substrate; a first electrode that is provided on an opposite side of the substrate across the first conductivity layer, the first electrode being provided in the semiconductor element; and a second electrode that is placed toward the back surface of the substrate, the second electrode being provided in the semiconductor element.

8 Claims, 12 Drawing Sheets

(51) Int. Cl.
*H01L 29/06* (2006.01)
*H01L 29/08* (2006.01)
*H01L 29/16* (2006.01)
*H01L 29/417* (2006.01)
*H01L 29/423* (2006.01)
*H01L 29/66* (2006.01)

(56) References Cited

U.S. PATENT DOCUMENTS

| | | |
|---|---|---|
| 2017/0012122 A1 | 1/2017 | Takaya et al. |
| 2017/0263757 A1 | 9/2017 | Saikaku et al. |
| 2018/0151366 A1* | 5/2018 | Endo ................... H01L 29/1095 |
| 2019/0288107 A1 | 9/2019 | Saikaku et al. |
| 2019/0386131 A1* | 12/2019 | Takeuchi ............ H01L 21/0495 |

* cited by examiner

SEMICONDUCTOR DEVICE AND MANUFACTURING PROCESS THEREFOR

CROSS REFERENCE TO RELATED APPLICATION

The present application is a continuation application of International Patent Application No. PCT/JP2018/034065 filed on Sep. 13, 2018 which designated the U. S. and claims the benefit of priority from Japanese Patent Application No. 2017-176776 filed on Sep. 14, 2017. The entire disclosures of all of the above applications are incorporated herein by reference.

TECHNICAL FIELD

The present disclosure relates to a semiconductor device and a method of manufacturing the semiconductor device, and more particularly, relates to a semiconductor element made of a wide bandgap semiconductor such as silicon carbide (hereinafter, referred to as SiC) and a method of manufacturing the semiconductor element.

BACKGROUND

In a semiconductor device having a cell region in which a semiconductor element such as a MOSFET is formed and an outer peripheral region surrounding the cell region, an outer peripheral withstand voltage structure for improving an element withstand voltage is provided in the outer peripheral region. As the outer peripheral withstand voltage structure, there is a guard ring structure. The guard ring structure is configured by forming a p-type guard ring so as to be in contact with a bottom surface of a recess portion provided around the cell region, and multiple p-type guard rings are concentrically arranged so as to surround the cell region.

SUMMARY

The present disclosure describes a semiconductor device having a cell region that includes a semiconductor element and an outer peripheral region, the semiconductor device comprising: a substrate that is made of a semiconductor of a first or second conductivity type; a first conductivity layer that is made of the semiconductor of the first conductivity type having a lower impurity concentration than impurity concentration of the substrate; a first electrode; and a second electrode.

BRIEF DESCRIPTION OF DRAWINGS

Objects, features and advantages of the present disclosure will become more apparent from the following detailed description made with reference to the accompanying drawings. In the drawings.

DETAILED DESCRIPTION

Figure 1:
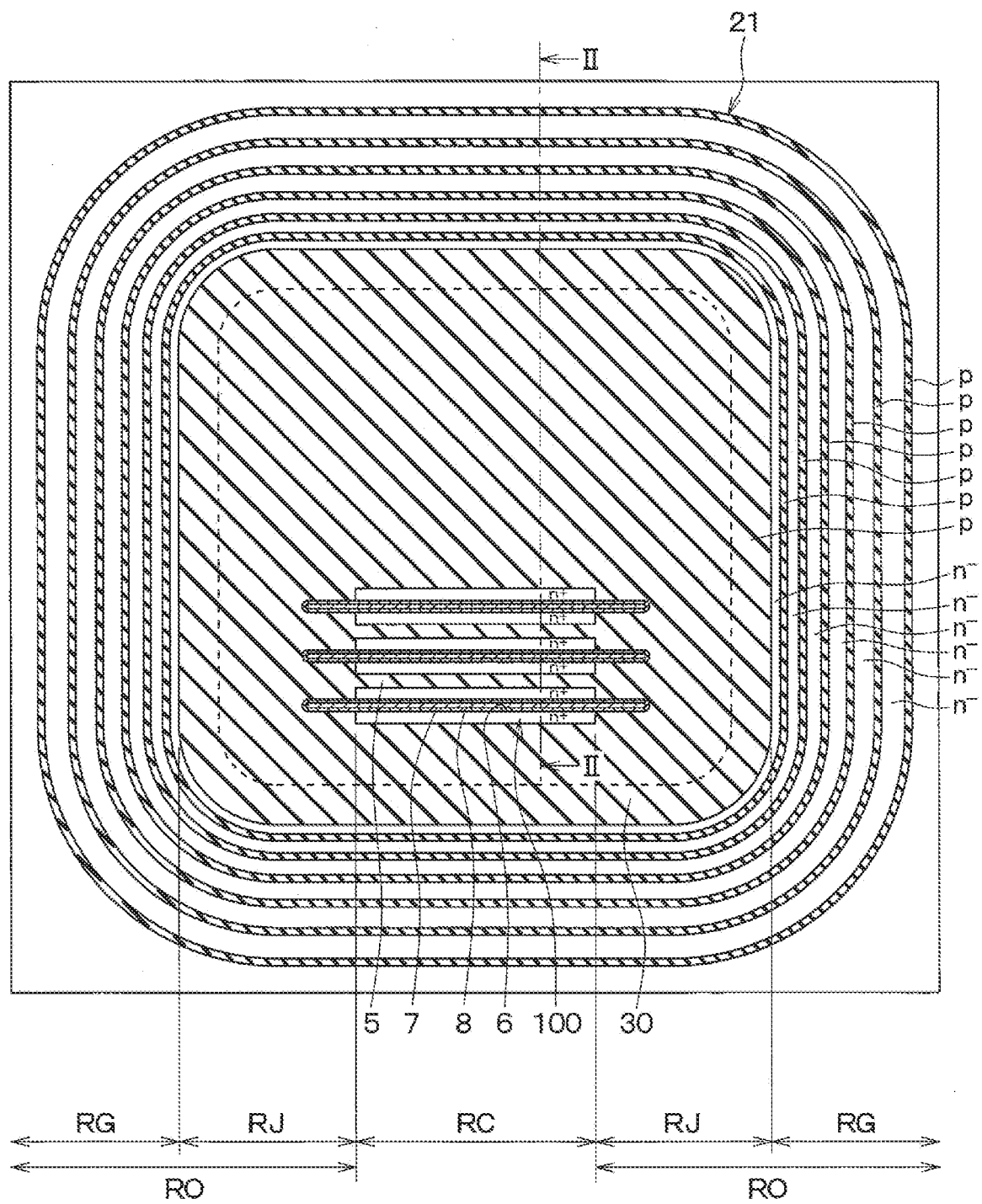
FIG. 1 is a top view layout diagram of an SiC semiconductor device according to a first embodiment.

According to the guard ring structure in a semiconductor device, equipotential lines may be extended from the cell region toward the outer peripheral region and gradually terminated in the guard ring structure, so that a withstand voltage may be improved by alleviating the concentration of an electric field.

A related art describes a structure capable of reducing an on-resistance of a MOSFET formed in a cell region in a semiconductor device. In the above semiconductor device, after a p-type high concentration region serving as a lower portion of an electric field relaxation layer is formed in a surface layer portion of an n$^-$-type layer, an n-type high concentration layer configuring a current dispersion layer is formed on the n-type layer and the p-type high concentration region, and a p-type low concentration region serving as an upper portion of the electric field relaxation layer is further formed in the n$^-$-type high concentration layer. In addition, a p-type base region is formed on the n-type high concentration layer and the electric field relaxation layer, an n$^+$-type source region is formed on the p-type base region, and a trench gate structure is provided so as to penetrate through the n$^+$-type source region and the p-type base region. In this manner, not all of the n-type layers configuring the drift layer are n$^-$-type layers, but a part of the n-type layers is set to be high in impurity concentration as the n-type high concentration layer. The n-type high concentration layer described above is configured to function as a current dispersion layer in which a current is also dispersed in a lateral direction, that is, in a normal direction of a channel region formed on a side surface of the trench gate structure, reducing an on-resistance.

In a structure of a semiconductor device, since the p-type guard ring is in contact with the bottom surface of the recess portion, the p-type guard ring is in contact with an interlayer insulating film formed on the p-type guard ring. For that reason, a boundary portion of a PN junction formed by the p-type guard ring and the n-type layer around the p-type guard ring is in contact with an interlayer insulating film, and an electric field concentration occurs in the PN junction, and a high electric field may be applied to the interlayer insulating film in contact with the PN junction. Therefore, when an interlayer insulating film or a protective film is further formed on the interlayer insulating film, an electric field intensity at the outermost surface of the interlayer insulating film may increase, resulting in a case that a creeping breakdown may occur. In particular, when SiC is used as the semiconductor material, since a high voltage is used, the electric field intensity at the outermost surface may become higher, and the difficulty may become conspicuous.

In the case of the structure including the current dispersion layer as disclosed in a related art, an n-type layer configuring the current dispersion layer is also formed in the outer peripheral region. In that instance, after a lower portion of the p-type guard ring is formed when the p-type high concentration region is formed in the surface layer portion of n$^-$-type layer, the n-type high concentration layer is also formed in the outer peripheral region when the n-type high concentration layer configuring the current dispersion layer is formed on the p-type guard ring. When the p-type low concentration region is formed in the n-type high concentration layer in the cell region, the p-type guard ring may be formed by forming an upper portion of the p-type high concentration region in the n-type high concentration region formed in the outer peripheral region.

Even in a case of the configuration described above, since the boundary portion of the PN junction between the p-type guard ring and the n-type high concentration layer surrounding the p-type guard ring is in contact with the interlayer insulating film, the same difficulty as described above may occur.

The upper portion and the lower portion of the p-type guard ring are formed in separate processes, and formation positions of the upper portion and the lower portion may be deviated due to a mask deviation when forming the respective upper and lower portions. In that case, an interval between the adjacent p-type guard rings may become narrow, and the electric field relaxation function of the p-type guard rings may not be exhibited, resulting in a case that the withstand voltage in the outer peripheral region may not be obtained.

The present disclosure describes a semiconductor device and a method of manufacturing the semiconductor device which are capable of inhibiting a creeping breakdown caused by an electric field concentration at a PN junction between a guard ring provided in an outer peripheral region and a periphery of the guard ring. A second object of the present disclosure is to provide a semiconductor device and a method of manufacturing the semiconductor device which are capable of inhibiting a drop in withstand voltage in an outer peripheral region due to a narrowing of an interval between guard rings when a current dispersion layer is formed.

According to one aspect of the present disclosure, a semiconductor device having a cell region that includes a semiconductor element and an outer peripheral region that surrounds an outer periphery of the cell region may comprise a substrate that is made of a semiconductor of a first or second conductivity type; and a first conductivity layer that is formed on the substrate and made of the semiconductor of the first conductivity type having a lower impurity concentration than impurity concentration of the substrate.

The outer peripheral region includes a plurality of second conductivity guard rings that is placed away from a surface of the first conductivity layer in a surface layer portion of the first conductivity layer, each second conductivity guard rings having frame-shaped line-like structure and surrounding the cell region, and the outer peripheral region further includes an interlayer insulation film formed on the surface of the first conductivity layer.

In the semiconductor device configured as described above, since each guard ring is formed at a position away from the surface of the first conductivity type layer, a boundary portion of a PN junction between the guard ring and the first conductivity type layer is in a state away from the interlayer insulating film. For that reason, even if an electric field concentration occurs in the PN junction, since the interlayer insulating film comes out of contact with the PN junction, the electric field intensity applied to the interlayer insulating film can be inhibited. Therefore, when the interlayer insulating film is formed or a protective film is further formed on the interlayer insulating film, an increase in electric field intensity at the outermost surface can be inhibited, and the occurrence of a creeping breakdown can be inhibited. In particular, when SiC is used as the semiconductor material, an electric field intensity at the outermost surface can be increased by use of a high voltage; however, even when SiC is used, the occurrence of a creeping breakdown can be inhibited.

In the semiconductor device according to another aspect of the present disclosure, the first conductivity type layer includes a first layer formed on the surface of the substrate and having the guard rings formed on the surface layer portion, and a second layer formed on the guard rings and the first layer and having a first conductivity type impurity concentration higher than that of the first layer.

As described above, when the first conductivity type layer is formed of the first layer and the second layer having the first conductivity type impurity concentration higher than that of the first layer, the current dispersion layer can be formed of the second layer. In such a case, the guard ring is formed on the surface layer portion of the first layer and the second layer is formed on the guard ring, that is, the guard ring is not formed on the second layer, thereby being capable of preventing a case that an interval between the guard rings is shortened due to the mask deviation from each other. Therefore, when the second layer configuring the current dispersion layer is formed, a drop in withstand voltage in the outer peripheral region due to the narrowing of the interval between the guard rings can be inhibited.

Incidentally, reference numerals with parentheses attached to the respective components and the like indicate an example of a correspondence relationship between the components and the like and specific components and the like described in the embodiment to be described later.

Embodiments of the present disclosure will be described below with reference to the drawings. In the following embodiments, the same reference numerals are assigned to parts that are the same or equivalent to each other for description.

First Embodiment

A first embodiment will be described. In this example, an SiC semiconductor device in which an inverted MOSFET having a trench gate structure is formed as a semiconductor device is exemplified.

An SiC semiconductor device shown in FIG. 1 has a structure having a cell region RC in which a MOSFET 100 of a trench gate structure is formed, and an outer peripheral region RO surrounding the cell region RC. The outer peripheral region RO is configured to have a guard ring portion RG and a connection portion RJ disposed inside the guard ring portion RG, that is, between the cell region RC and the guard ring portion RG. It should be noted that FIG. 1 is not a cross-sectional view, but is partially hatched for the sake of clarity.

Figure 2:
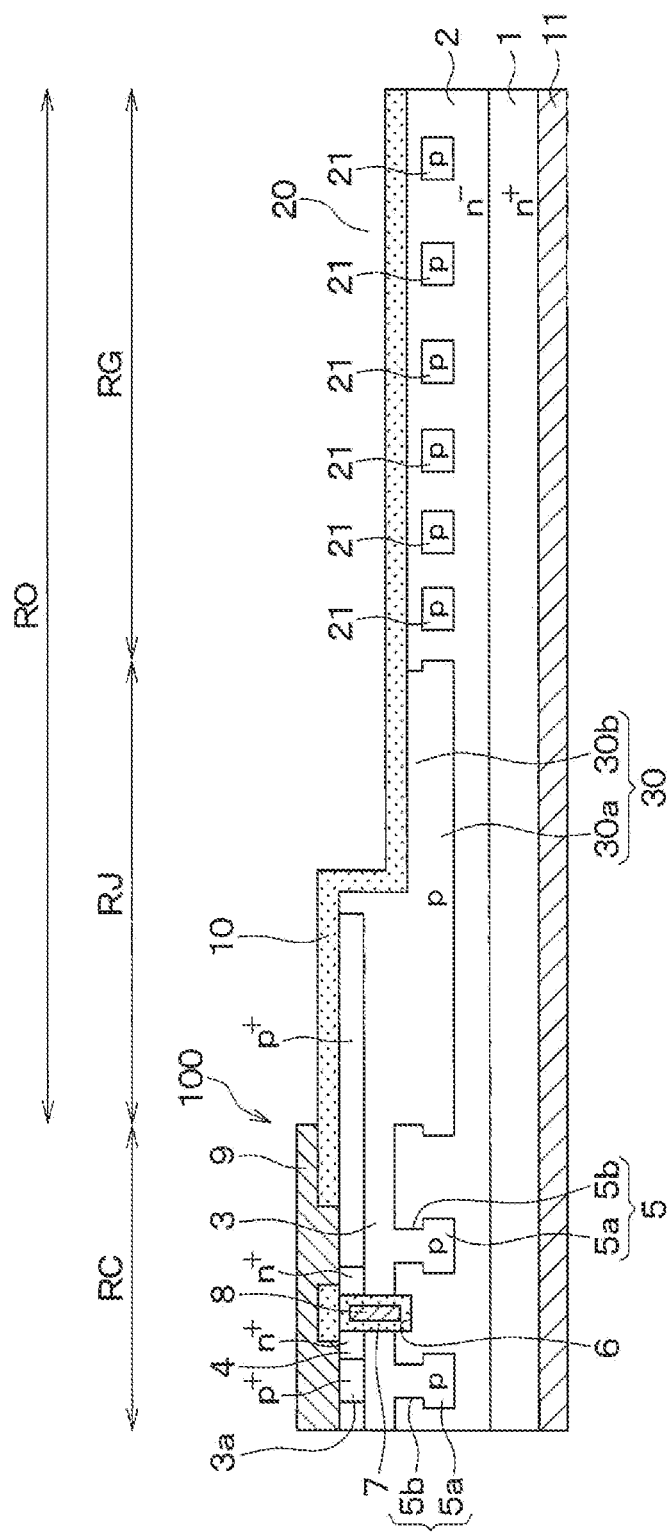
FIG. 2 is a cross-sectional view taken along a line II-II of FIG. 1.

As shown in FIG. 2, the SiC semiconductor device is formed of an n$^+$-type substrate 1 made of SiC. On a main surface of the n$^+$-type substrate 1, an n$^-$-type layer 2 made of SiC and a p-type base region 3 are formed by epitaxial growth or the like, and an n$^+$-type source region 4 is formed in a surface layer portion of the p-type base region 3. The n$^-$-type layer 2 corresponds to a first conductivity type layer or first conductivity layer.

The n$^+$-type substrate 1 is, for example, an off-substrate that is $1.0 \times 10^{19}/cm^3$ in n-type impurity concentration, and has a surface of a (0001) Si surface and an off-direction of a <11-20> direction. The n$^-$-type layer 2 has, for example, an n-type impurity concentration of $5.0 \times 10^{15}$ to $2.0 \times 10^{16}/cm^3$. In the present embodiment, the n$^-$-type layer 2 configures an n-type layer serving as a drift layer.

Further, the p-type base region 3 has the p-type impurity concentration of, for example, about $2.0 \times 10^{17}/cm^3$, and the thickness of 300 nm in the portion where the channel region is formed. A p-type contact region 3a partially having a high concentration p-type impurity is formed in the surface layer portion of the p-type base region 3, that is, in a position sandwiched between the n$^+$-type source regions 4. The n$^+$-type source region 4 is a higher impurity concentration than that of the n$^-$-type layer 2, and the n-type impurity concentration in the surface layer portion is, for example, $2.5 \times 10^{18}$ to $1.0 \times 10^{19}/cm^3$, and the thickness is about 0.5 µm.

In the cell region RC, the p-type base region 3 and the n$^+$-type source region 4 are left on the front surface side of the n$^+$-type substrate 1, and in the guard ring portion RG, a recess portion 20 is provided so as to penetrate through the p-type base region 3 and reach the n$^-$-type layer 2. With the structure described above, a mesa portion in which the cell region RC and the connection portion RJ protrude from the guard ring portion RG is formed.

In the cell region RC, p-type deep layers 5 corresponding to the first deep layer having a higher p-type impurity concentration than that of the p-type base region 3 are formed in the surface layer portion of the n$^-$-type layer 2. More specifically, the p-type deep layers 5 are formed to reach the front surface from a position at a predetermined depth of n$^-$-type layer 2, and are formed by, for example, implanting p-type impurity ions into the n$^-$-type layer 2.

The multiple p-type deep layers 5 are disposed at regular intervals in the n$^-$-type layer 2, and are disposed apart from each other without intersections, thereby forming stripes. The p-type base region 3 and the n$^+$-type source region 4 are formed on the p-type deep layers 5.

Each of the p-type deep layers 5 is formed with the same impurity concentration, the same width, and the same depth. For example, the p-type impurity concentration is $1.0 \times 10^{17}$ to $1.0 \times 10^{19}/cm^3$, the width is 0.7 µm, and the depth is about 2.0 µm. As shown in FIG. 1, each of the p-type deep layers 5 is formed from one end of the cell region RC to the other end. In the present embodiment, each of the p-type deep layers 5 extends in the same direction as that of the trench gate structure to be described later as a longitudinal direction, and is connected to a p-type deep layer 30 of the connection portion RJ to be described later, which extends outside the cell region RC at both ends of the trench gate structure.

The extension direction of the p-type deep layers 5 is arbitrary, and in the present embodiment, is a <11-20> direction which is the same as that of the off direction.

Gate trenches 6 each having, for example, a width of 0.8 µm and a depth of 1.0 µm are formed so as to penetrate through the p-type base region 3 and the n$^+$-type source region 4, reach the n$^-$-type layer 2, and be set to be shallower than the p-type deep layers 5. The p-type base region 3 and the n$^+$-type source region 4 are disposed so as to be in contact with side surfaces of the gate trenches 6. The gate trenches 6 are formed in a line-like layout in which a width direction is a horizontal direction of a paper plane, a length direction is a vertical direction of the paper plane, and a depth direction is a vertical direction of the paper plane in FIG. 2. As shown in FIG. 1, the multiple gate trenches 6 are disposed so as to be sandwiched between the p-type deep layers 5, and are aligned in parallel with each other at regular intervals to form stripes.

In this example, portions of the p-type base region 3 located on the side surfaces of the gate trenches 6 function as channel regions connecting the n$^+$-type source region 4 and the n$^-$-type layer 2 when the vertical MOSFET 100 is operated. Gate insulation films 7 are formed on inner wall surfaces of the gate trenches 6 including the channel regions. Gate electrodes 8 made of doped Poly-Si are formed on surfaces of the gate insulation films 7, and the gate trenches 6 are filled with the gate insulation films 7 and the gate electrodes 8. As a result, a trench gate structure is formed. In FIG. 1, the number of trench gate structures and the number of p-type deep layers 5 are reduced for the sake of clarity, but in reality, a large number of similar structures are disposed.

Further, a source electrode 9 corresponding to a first electrode, a gate wire layer not shown, and so on are formed through an interlayer insulation film 10 on an opposite side of the n$^+$-type substrate 1 across the n$^-$-type layer 2, specifically, over the surfaces of the n$^+$-type source region 4, the p-type deep layers 5 and the gate electrodes 8. The source electrode 9 and the gate wire layer are made of multiple metals, for example, Ni/Al. At least a portion of the multiple metals which is in contact with the n-type SiC, more specifically, the n$^+$-type source region 4 is made of a metal capable of coming in ohmic contact with the n-type SiC. In addition, at least a portion of the multiple metals which comes in contact with the p-type SiC, more particularly, a portion which comes in contact with the p-type contact region 3a is made of a metal capable of coming in ohmic contact with the p-type SiC. The source electrode 9 and the gate wire layer are electrically insulated from each other by being separated on the interlayer insulation film 10. The source electrode 9 is electrically brought in electric contact with the n$^+$-type source region 4 and the p-type contact region 3a through a contact hole provided in the interlayer insulation film 10, and the gate wire layer is brought in electric contact with the gate electrodes 8.

Further, a drain electrode 11 corresponding to a second electrode electrically connected to the n$^+$-type substrate 1 is formed on a back surface of the n$^+$-type substrate 1. The structure described above configures a MOSFET 100 with an n-channel type inverted trench gate structure. The MOSFET 100 described above is provided with multiple cells to configure the cell region RC.

On the other hand, in the guard ring portion RG, as described above, the recess portion 20 is provided so as to penetrate through the p-type base region 3 and reach the n$^-$-type layer 2. For that reason, the n$^+$-type source region 4 and the p-type base region 3 are removed at a position away from the cell region RC to expose the n$^-$-type layer 2. In the thickness direction of the n$^+$-type substrate 1, parts of the cell region RC and the connection portion RJ located inside the recess portion 20 form mesas protruding in an island-like shape.

Multiple p-type guard rings 21 are provided in the surface layer portion of the n$^-$-type layer 2 located below the recess portion 20 so as to surround the cell region RC and the connection portion RJ. In the present embodiment, the p-type guard rings 21 each have a rectangular shape with four corners rounded, but may have another frame shape such as a circular shape. Each of the p-type guard rings 21 is formed from a position away from the surface of the n$^-$-type layer 2 to a position at a predetermined depth, and is formed by, for example, implantation of the p-type impurity ions into the n$^-$-type layer 2. In the present embodiment, although a lower surface of the p-type guard ring 21 has the same depth as that of the lower surface of the p-type deep layer 5, since the p-type guard ring 21 is not formed up to the surface of the n$^-$-type layer 2 unlike the p-type deep layer 5, an upper surface of the p-type guard ring 21 is located deeper than the upper surface of the p-type deep layer 5. The p-type guard ring 21 corresponds to a second conductivity type guard ring or a second conductivity guard ring.

In the present embodiment, the p-type guard ring 21 has the same configuration as the p-type deep layer 5 described above except that the depth is different. The p-type guard ring 21 is different from the p-type deep layer 5 formed in a linear shape in that an upper surface shape of the p-type guard ring 21 is formed in a frame-shaped line-like form surrounding the cell region RC and the connection portion RJ, but is otherwise the same. In other words, the p-type guard ring 21 has the same impurity concentration and the same width as those of the p-type deep layer 5. The intervals between the p-type guard rings 21 may be equal to each other. In this example, the intervals between the p-type guard rings 21 is set to be narrower on the cell region RC side and larger on the outer peripheral side so that the electric field concentration is alleviated on the inner peripheral side, that is, on the cell region RC side, and the equipotential lines are made more toward the outer peripheral side.

Although not shown, an EQR (Equi-potential Ring) structure is provided on the outer periphery of the p-type guard ring 21 as necessary, thereby forming the guard ring portion RG provided with an outer peripheral withstand voltage structure surrounding the cell region RC.

Further, an area from the cell region RC to the guard ring portion RG is defined as the connection portion RJ, and in the connection portion RJ, the p-type deep layer 30 corresponding to the second deep layer is formed in the surface layer portion of the n-type layer 2. Since the p-type deep layer 30 is in contact with the p-type base region 3, the p-type deep layer 30 is fixed to a source potential. In the case of the present embodiment, as hatched by solid lines in FIG. 1, the connection portion RJ is formed so as to surround the cell region RC, and the multiple square p-type guard rings 21 having four corners rounded are formed so as to surround the outside of the connection portion RJ. The p-type deep layer 30 is formed in a portion hatched by the solid lines serving as the connection portion RJ, and is connected to the p-type deep layers 5 formed in the cell region RC.

Each p-type deep layer 30 is formed, for example, by implanting the p-type impurity ions into the surface of the n$^-$-type layer 2. The impurity concentration and depth of the p-type deep layer 30 are the same as those of the p-type deep layer 5 described above.

Further, the interlayer insulation film 10 is also formed on the surface of the n$^+$-type source region 4 in the connection portion RJ.

As described above, with the structure in which the connection portion RJ is provided between the cell region RC and the guard ring portion RG, and the p-type deep layer 30 is formed in the connection portion RJ so as to be connected to the p-type deep layer 5 disposed on both sides of the trench gate structure. This makes it possible to inhibit the equipotential lines from excessively rising in the cell region RC, and to extend the equipotential lines from the cell region RC toward the guard ring portion RG and to terminate the equipotential lines in the guard ring portion RG.

The SiC semiconductor device according to the present embodiment is configured by the structure described above. In the SiC semiconductor device configured as described above, when the MOSFET 100 is turned on, channel regions are formed in the surface portion of the p-type base region 3 located on the side surfaces of the gate trenches 6 by controlling a voltage applied to the gate electrode 8. As a result, a current flows between the source electrode 9 and the drain electrode 11 through the n$^+$-type source region 4 and the n$^-$-type layer 2.

When the MOSFET 100 is turned off, even if a high voltage is applied, the p-type deep layers 5 and the p-type deep layer 30 formed up to a position deeper than that of the trench gate structure inhibit the entry of an electric field into the bottom portions of the gate trenches. For that reason, the electric field concentration at the bottom portions of the gate trenches is reduced. As a result, breakdown of the gate insulation film 7 is prevented.

Further, in the connection portion RJ, the rising of the equipotential lines is inhibited, and the equipotential lines are directed toward the guard ring portion RG side. In the guard ring portion RG, the equipotential lines are gradually terminated toward the outer peripheral direction by the p-type guard rings 21, and a desired withstand voltage can be obtained also in the guard ring portion RG.

In the SiC semiconductor device according to the present embodiment, since the p-type guard rings 21 are formed at positions away from the surface of the n-type layer 2, the boundary portion of the PN junction between the p-type guard rings 21 and the n$^-$-type layer 2 is separated from the interlayer insulation film 10. For that reason, even if the electric field concentration occurs in the PN junction, since the interlayer insulation film 10 is out of contact with the PN junction, the electric field intensity to be applied to the interlayer insulation film 10 can be inhibited. Therefore, when the interlayer insulation film 10 is formed or a protective film (not shown) is formed on the interlayer insulation film, the electric field intensity can be inhibited from increasing at the outermost surface of the interlayer insulation film or the protective film, and the occurrence of creeping breakdown can be inhibited. In particular, since SiC is used as the semiconductor material, the electric field intensity at the outermost surface can be increased by use of a high voltage, but even when SiC is used, the occurrence of creeping breakdown can be inhibited.

Figure 3:
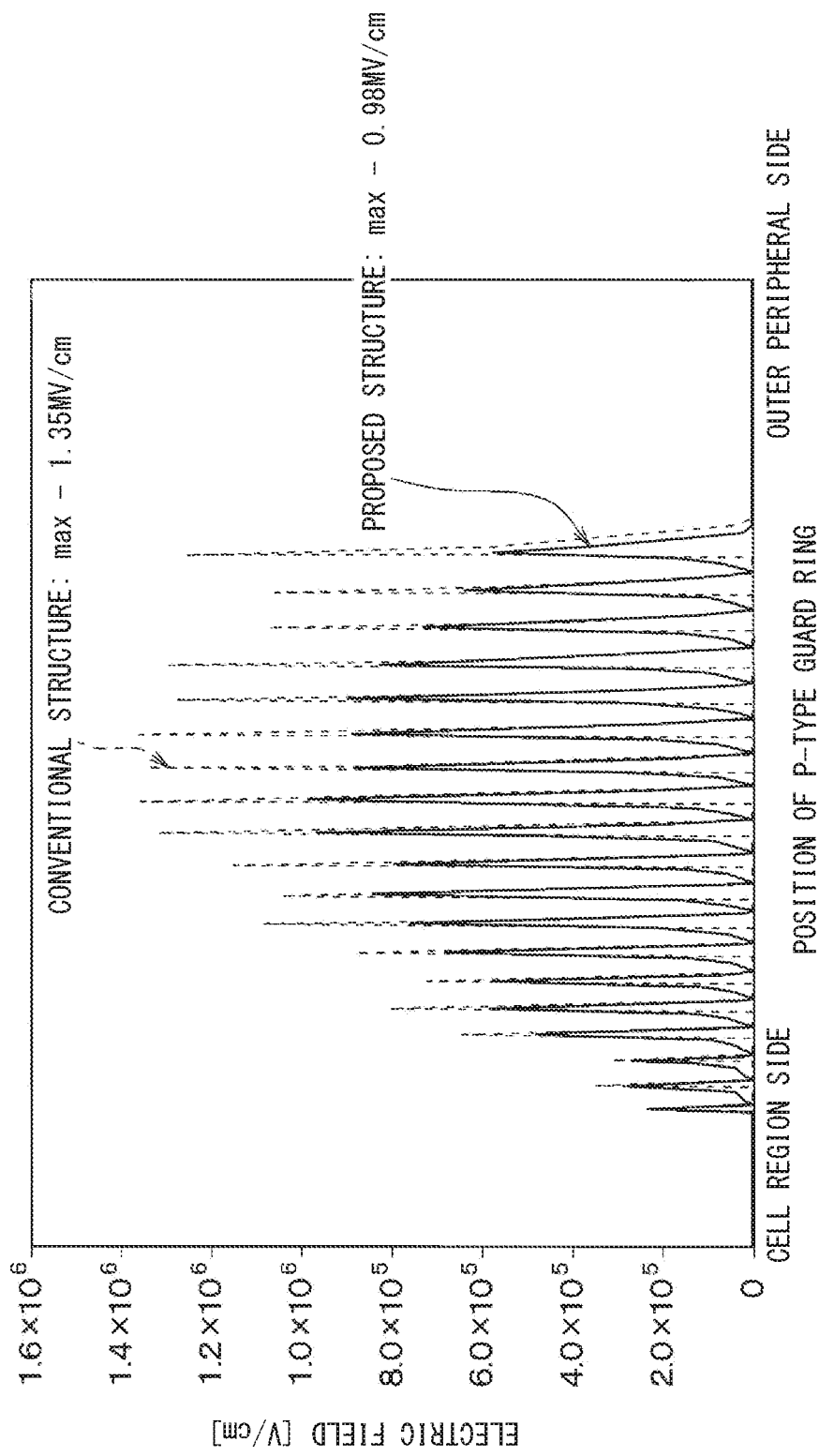
FIG. 3 is a diagram showing a relationship between a position of a p-type guard ring and an electric field intensity.

As a reference, in the case of separating the p-type guard rings 21 from the interlayer insulation film 10, and in the case of bringing the p-type guard rings 21 in contact with the interlayer insulation film 10, a change in the electric field intensity at an interface between the interlayer insulation film 10 and SiC is investigated by simulation. FIG. 3 shows the results. In this example, a simulation is performed in the case of forming eighteen p-type guard rings 21.

As shown in FIG. 3, in the structure in which the p-type guard rings 21 are formed so as to be in contact with the interlayer insulation film 10 as in the conventional art, the electric field intensity is increased at the boundary position between the n$^-$-type layer 2 and the outer peripheral side of each p-type guard ring 21. At a point where the electric field intensity is maximized, the electric field intensity is 1.35 MV/cm, which is an extremely large value.

On the other hand, even in the case of forming the p-type guard rings 21 away from the interlayer insulation film 10 as in the present embodiment, the electric field intensity is increased at the boundary position between the n$^-$-type layer 2 and the outer peripheral side of each p-type guard ring 21. However, the electric field intensity is 0.98 MV/cm at the maximum, which is a value sufficiently smaller than that of the conventional structure. From the above fact, it is understood that the structure of the present embodiment can inhibit the electric field intensity at the interface between the interlayer insulation film 10 and SiC.

Next, a process of manufacturing the SiC semiconductor device according to the present embodiment will be described by referring to FIGS. 4A to 4I.

Figure 4A:
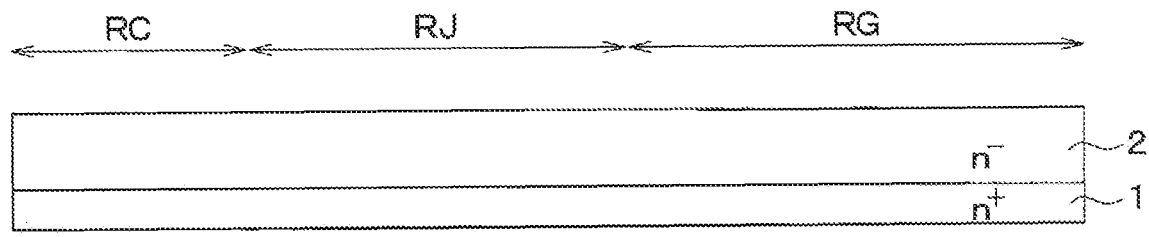
FIG. 4A is a cross-sectional view showing a process of manufacturing an SiC semiconductor device shown in FIGS. 1 and 2.

(Process Shown in FIG. 4A)

First, as a semiconductor substrate, a semiconductor substrate obtained by epitaxially growing an n$^-$-type layer 2 made of SiC on a main surface of an n$^+$-type substrate 1 is prepared. At this time, a semiconductor substrate may be prepared by epitaxially growing the n$^-$-type layer 2 on the main surface of the n$^+$-type substrate 1, or a so-called epitaxial substrate in which the n$^-$-type layer 2 is epitaxially grown on the main surface of the n$^+$-type substrate 1 in advance may be prepared as a semiconductor substrate.

Figure 4B:
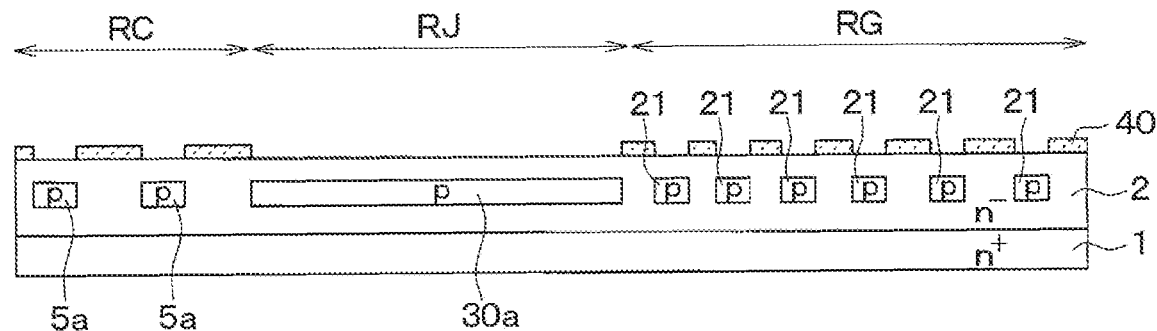
FIG. 4B is a cross-sectional view showing a process of manufacturing the SiC semiconductor device subsequent to the SiC semiconductor device of FIG. 4A.

(Process Shown in FIG. 4B)

Next, a mask 40 is disposed on the n$^-$-type layer 2, and the mask 40 is opened in regions where p-type deep layers 5, a p-type deep layer 30, and p-type guard rings 21 are to be formed. Then, p-type impurity ions are implanted by use of the mask 40. At this time, an ion implantation range is adjusted so that the p-type impurity is implanted at a position deeper than the surface of the n$^-$-type layer 2 by a predetermined depth, and the p-type impurity is not substantially implanted into the surface of the n$^-$-type layer 2. As a result, lower portions 5a of the p-type deep layers 5, a lower portion 30a of the p-type deep layer 30, and the p-type guard rings 21 are formed. Thereafter, the mask 40 is removed.

Figure 4C:
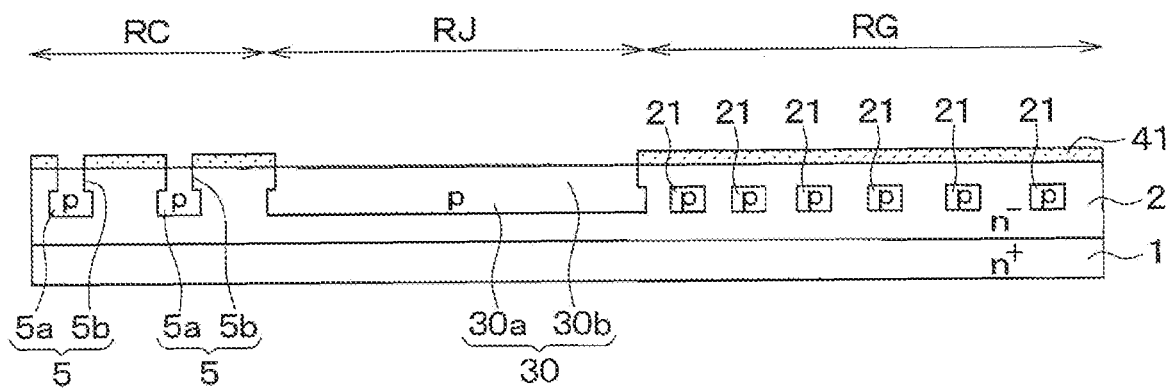
FIG. 4C is a cross-sectional view showing a process of manufacturing the SiC semiconductor device subsequent to the SiC semiconductor device of FIG. 4B.

(Process Shown in FIG. 4C)

Subsequently, a mask 41 is disposed, and the mask 41 is opened in regions where the p-type deep layers 5 and the p-type deep layer 30 are to be formed. At this time, the mask 41 is not opened in the regions where the p-type guard rings 21 are to be formed. Then, p-type impurity ions are implanted by use of the mask 41. As a result, upper portions 5b of the p-type deep layers 5 and an upper portion 30b of the p-type deep layer 30 are formed, and the p-type deep layers 5 and the p-type deep layer 30 are formed in connection with the lower portions 5a of the p-type deep layers 5 and the lower portion 30a of the p-type deep layer 30, which have been formed in advance. Thereafter, the mask 41 is removed.

The widths of the upper portions 5b and 30b and the lower portions 5a and 30a of the p-type deep layers 5 and the p-type deep layer 30 may be the same, or may be different. In the present embodiment, the widths of the upper portions 5b and 30b of the p-type deep layers 5 and the p-type deep layer 30 are set to be narrower than those of the lower portions 5a and 30a. Alternatively, the order of the processes shown in FIGS. 4B and 4C may be changed, and the process shown in FIG. 4C may be performed prior to the process shown in FIG. 4B.

Figure 4D:
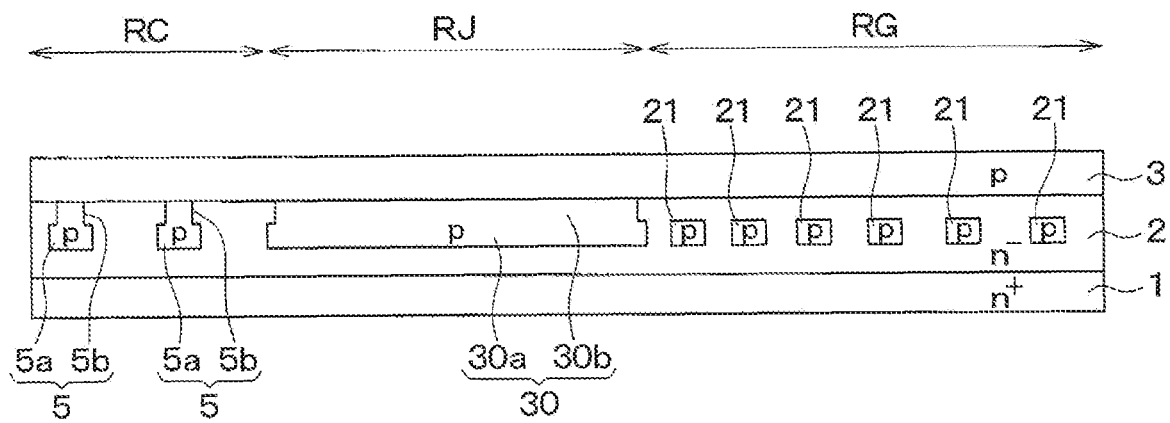
FIG. 4D is a cross-sectional view showing a process of manufacturing the SiC semiconductor device subsequent to the SiC semiconductor device of FIG. 4C.

(Process Shown in FIG. 4D)

The p-type base region 3 is epitaxially grown on the n$^-$-type layer 2 including the p-type deep layers 5, the p-type deep layer 30, and the p-type guard rings 21.

Figure 4E:
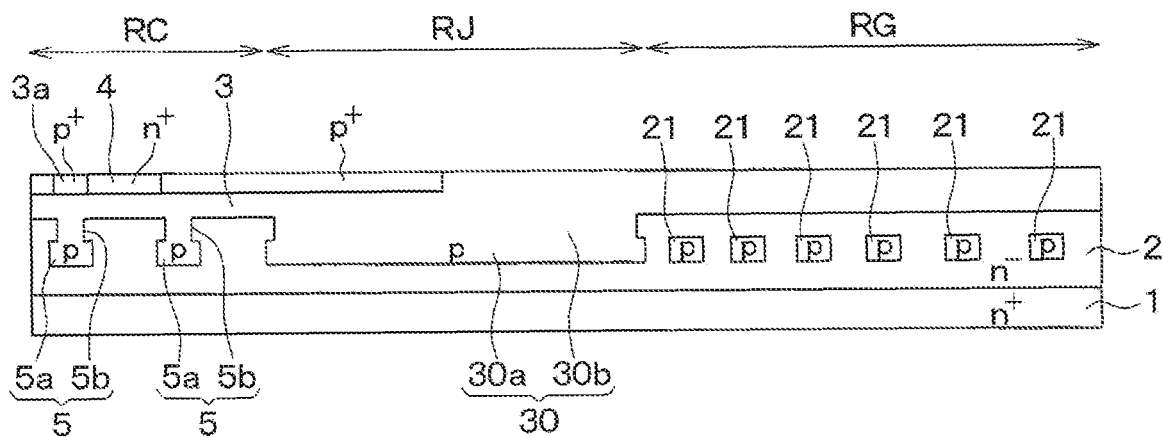
FIG. 4E is a cross-sectional view showing a process of manufacturing the SiC semiconductor device subsequent to the SiC semiconductor device of FIG. 4D.

(Process Shown in FIG. 4E)

After a mask (not shown) has been disposed on the p-type base region 3, the mask is opened in a region where the n$^+$-type source region 4 is to be formed. Then, n-type impurity ions are implanted by use of the mask to form the n$^+$-type source region 4. After the mask has been removed, a mask (not shown) is disposed again, and the mask is opened in a region where the p-type contact region 3a is to be formed. Then, p-type impurity ions are implanted by use of the mask to form the p-type contact region 3a. Thereafter, the mask is removed.

In this example, the n$^+$-type source region 4 and the p-type contact region 3a are formed by ion implantation. Alternatively, one of the source region 4 and the p-type contact region 3a may be formed by epitaxial growth and the other may be formed by ion implantation.

Figure 4F:
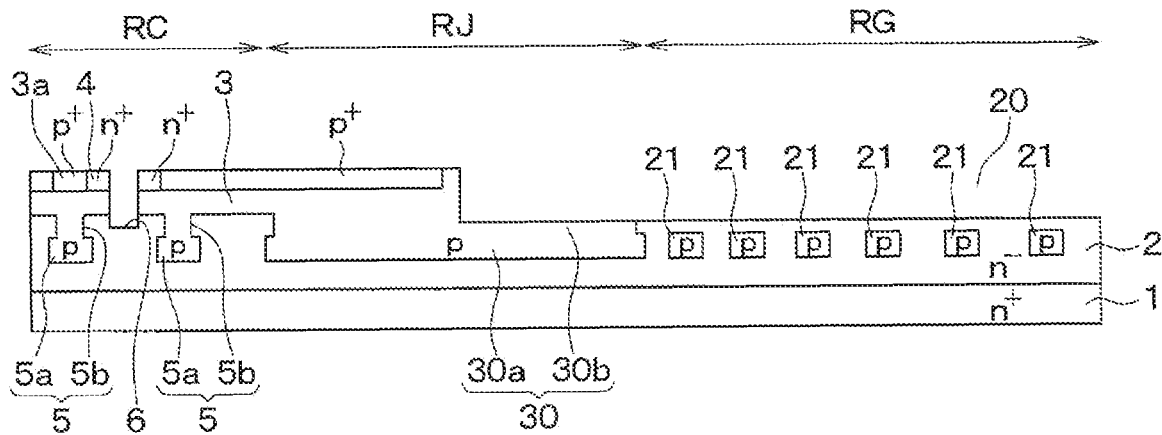
FIG. 4F is a cross-sectional view showing a process of manufacturing the SiC semiconductor device subsequent to the SiC semiconductor device of FIG. 4E.

(Process Shown in FIG. 4F)

After a mask (not shown) has been formed on the n$^+$-type source region 4, the p-type base region 3, and the like, the mask is opened in regions where gate trenches 6 and a recess portion 20 are to be formed. Then, anisotropic etching such as RIE (Reactive Ion Etching) is performed by use of the mask to simultaneously form the gate trenches 6 and the recess portion 20 deeper than the upper surface of the n⁻-type layer 2 and shallower than the upper surfaces of the p-type guard rings 21.

Although the gate trenches 6 and the recess portion 20 are formed at the same time in this example, the gate trenches 6 and the recess portion 20 may be formed separately. In that case, since the gate trenches 6 and the recess portion 20 can have different depths, the gate trenches 6 and the recess portion 20 can be designed to have respective optimum depths.

Figure 4G:
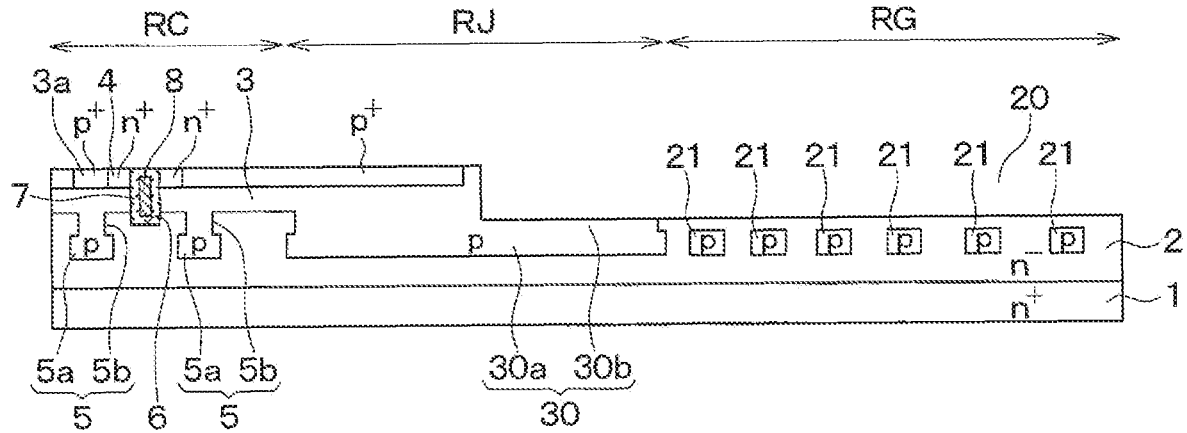
FIG. 4G is a cross-sectional view showing a process of manufacturing the SiC semiconductor device subsequent to the SiC semiconductor device of FIG. 4F.

(Process Shown in FIG. 4G)

After the mask has been removed, gate insulation films 7 are formed by, for example, thermal oxidation, and the gate insulation films 7 cover the inner wall surfaces of the gate trenches 6 and the surface of the n⁺-type source region 4. Then, a Poly-Si doped with a p-type impurity or an n-type impurity is deposited, and then etched back to leave at least the Poly-Si in the gate trenches 6, thereby forming the gate electrodes 8. As a result, a trench gate structure is formed.

Figure 4H:
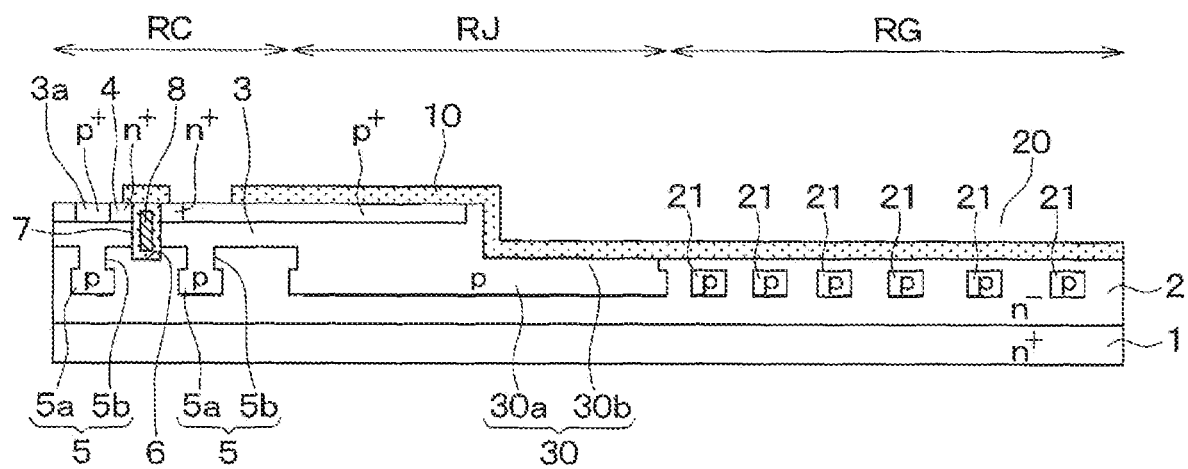
FIG. 4H is a cross-sectional view showing a process of manufacturing the SiC semiconductor device subsequent to the SiC semiconductor device of FIG. 4G.

(Process Shown in FIG. 4H)

An interlayer insulation film 10 made of, for example, an oxide film is formed so as to cover the surfaces of the gate electrodes 8 and the gate insulation films 7. After a mask (not shown) has been formed on a surface of the interlayer insulation film 10, the mask is opened in portions located between the gate electrodes 8, that is, the portions corresponding to the p-type contact region 3a and the vicinity of the p-type contact region 3a. Thereafter, the interlayer insulation film 10 is patterned by use of the mask to form contact holes exposing the p-type contact region 3a and the n⁺-type source region 4.

Figure 4I:
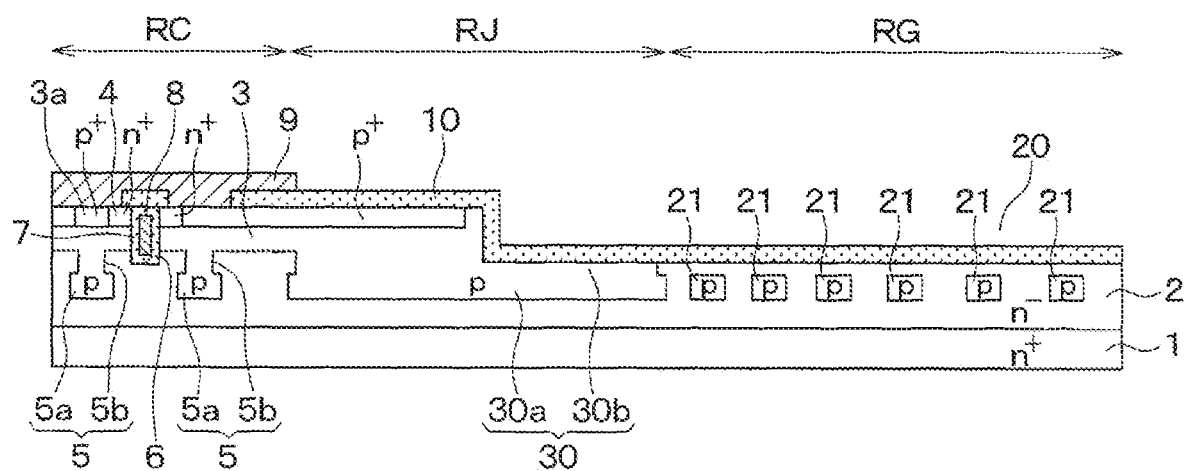
FIG. 4I is a cross-sectional view showing a process of manufacturing the SiC semiconductor device subsequent to the SiC semiconductor device of FIG. 4H.

(Process Shown in FIG. 4I)

An electrode material formed of, for example, a multilayer structure of multiple metals is formed on the surface of the interlayer insulation film 10. The source electrode 9, a gate wire (not shown), and the like are formed by patterning the electrode material.

The SiC semiconductor device according to the present embodiment is completed by performing a process such as forming the drain electrode 11 on a back surface of the n⁺-type substrate 1, although the subsequent process is not illustrated.

As described above, in the SiC semiconductor device according to the present embodiment, each of the p-type guard rings 21 is formed at a position away from the surface of the n⁻-type layer 2, and a boundary portion of a PN junction between the p-type guard ring 21 and the n⁻-type layer 2 are separated from the interlayer insulation film 10. For that reason, even if the electric field concentration occurs in the PN junction, since the interlayer insulation film 10 is out of contact with the PN junction, the electric field intensity to be applied to the interlayer insulation film 10 can be inhibited. Therefore, when the interlayer insulation film 10 is formed or a protective film (not shown) is formed on the interlayer insulation film, the electric field intensity can be inhibited from increasing at the outermost surface of the interlayer insulation film or the protective film, and the occurrence of creeping breakdown can be inhibited.

Second Embodiment

A second embodiment will be described. The present embodiment is the same as the first embodiment except that a manufacturing method is changed from that in the first embodiment, and therefore, portions different from the first embodiment will be mainly described.

The method of manufacturing the SiC semiconductor device according to the present embodiment will be described with reference to the method of manufacturing the SiC semiconductor device according to the first embodiment described above.

First, as in the process shown in FIG. 4A described in the first embodiment, a semiconductor substrate obtained by epitaxially growing an n⁻-type layer 2 made of SiC on a main surface of an n⁺-type substrate 1 is prepared as a semiconductor substrate. Then, processes shown in FIGS. 5A to 5D are performed.

Figure 5A:
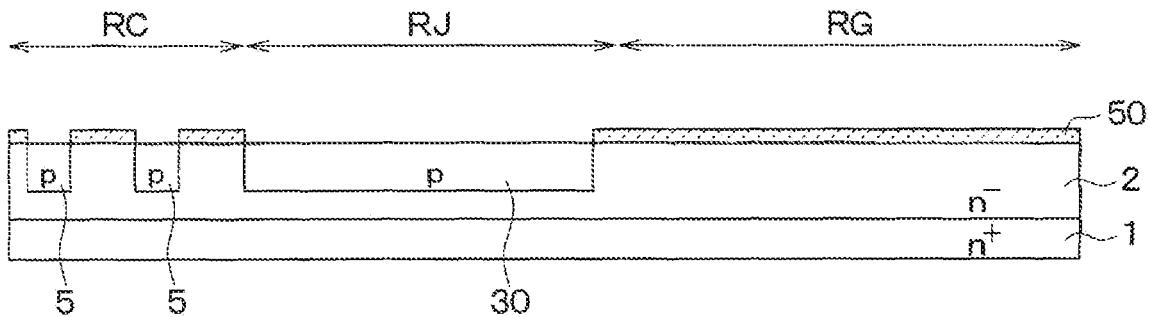
FIG. 5A is a cross-sectional view showing a process of manufacturing an SiC semiconductor device according to a second embodiment.

(Process Shown in FIG. 5A)

A mask 50 is disposed on the n⁻-type layer 2, and the mask 50 is opened in regions where p-type deep layers 5 and a p-type deep layer 30 are to be formed. Then, p-type impurity ions are implanted by use of the mask 50. As a result, the p-type deep layers 5 and the p-type deep layer 30 are formed. Thereafter, the mask 50 is removed.

Figure 5B:
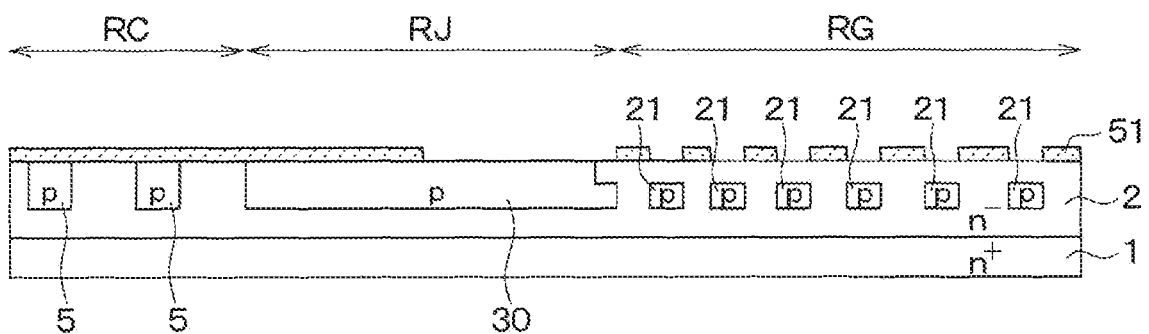
FIG. 5B is a cross-sectional view showing a process of manufacturing the SiC semiconductor device subsequent to the SiC semiconductor device of FIG. 5A.

(Process Shown in FIG. 5B)

Next, as a process shown in FIG. 5B, a mask 51 is disposed on the n⁻-type layer 2, and the mask 51 is opened in regions where the p-type deep layer 30 and p-type guard rings 21 are to be formed. Then, p-type impurity ions are implanted by use of the mask 51. At this time, an ion implantation range is adjusted so that the p-type impurity is implanted at a position deeper than the surface of the n⁻-type layer 2 by a predetermined depth, and the p-type impurity is not substantially implanted into the surface of the n⁻-type layer 2. As a result, the p-type guard rings 21 can be formed, and a portion of the p-type deep layer 30 on the p-type guard ring 21 side can be formed. Thereafter, the mask 51 is removed.

In this example, not only the p-type guard rings 21 are formed, but also the portion of the p-type deep layer 30 on the p-type guard ring 21 side is formed. This is because, when the p-type deep layer 30 is formed only in the process shown in FIG. 5A, there is a possibility that intervals between the p-type deep layer 30 and the p-type guard rings 21 vary according to a mask alignment accuracy. In this manner, an end portion of the p-type deep layer 30 on the p-type guard ring 21 side is also formed simultaneously when the p-type guard rings 21 are formed, thereby being capable of eliminating a variation in the intervals between the p-type deep layer 30 and the p-type guard rings 21.

Figure 5C:
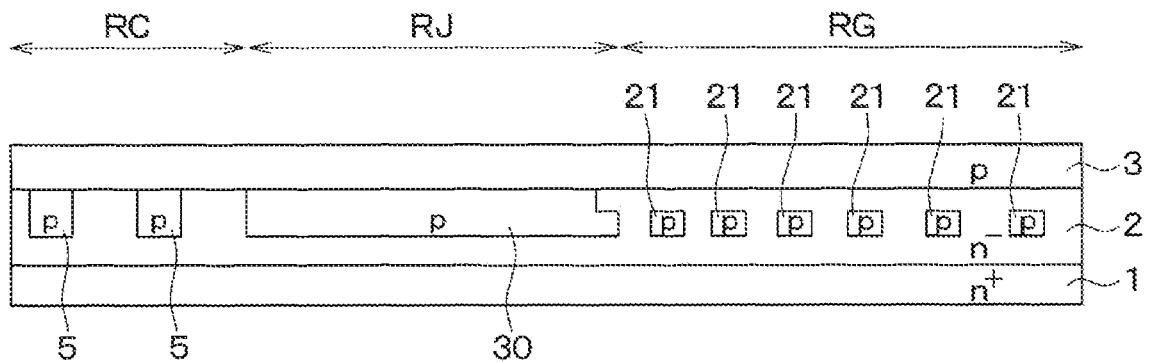
FIG. 5C is a cross-sectional view showing a process of manufacturing the SiC semiconductor device subsequent to the SiC semiconductor device of FIG. 5B.
Figure 5D:
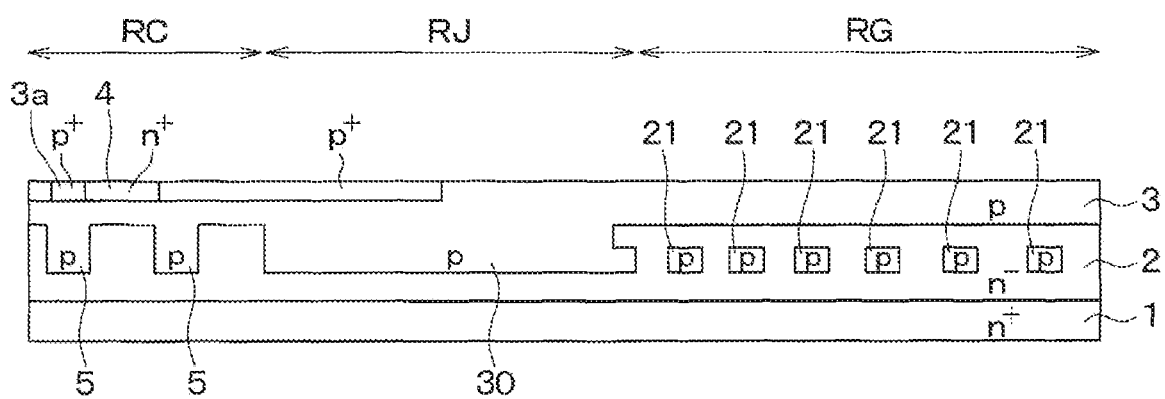
FIG. 5D is a cross-sectional view showing a process of manufacturing the SiC semiconductor device subsequent to the SiC semiconductor device of FIG. 5C.

Thereafter, as processes shown in FIG. 5C and FIG. 5D, the processes shown in FIG. 4D and FIG. 4E described in the first embodiment are performed. The subsequent processes are not illustrated, but the processes subsequent to the processes illustrated in FIG. 4F described in the first embodiment are then performed.

As described above, the process of forming the p-type deep layers 5 and the p-type deep layers 30 which are formed up to the surface of n⁻-type layer 2 and the process of forming the p-type guard rings 21 which are formed only to positions away from the surface of the n⁻-type layer 2 may be separately performed. Also, in this manner, the SiC semiconductor device having the structure shown in the first embodiment can be manufactured.

In addition, an end portion of the p-type deep layer 30 on the p-type guard ring 21 side is formed at the same time as the time of forming the p-type guard rings 21, thereby being capable of eliminating a variation in the intervals between the p-type deep layer 30 and the p-type guard rings 21. It is needless to say that the intervals between the p-type deep layer 30 and the p-type guard rings 21 may vary within an allowable range, and therefore, only the p-type guard rings 21 may be formed in the process shown in FIG. 5B.

Third Embodiment

A third embodiment will be described. The present embodiment is also a modification of the manufacturing method of the first embodiment, and the others are the same as those of the first embodiment, and therefore, portions different from those of the first embodiment will be mainly described.

The method of manufacturing the SiC semiconductor device according to the present embodiment will be described with reference to the method of manufacturing the SiC semiconductor device according to the first embodiment described above.

First, as in the process shown in FIG. 4A described in the first embodiment, a semiconductor substrate obtained by epitaxially growing an n⁻-type layer 2 made of SiC on a main surface of an n⁺-type substrate 1 is prepared as a semiconductor substrate.

In addition, the p-type deep layers 5 and the p-type deep layer 30 are formed by performing the same process as the process shown in FIG. 5A described in the second embodiment. Then, processes shown in FIGS. 6A to 6D are performed.

Figure 6A:
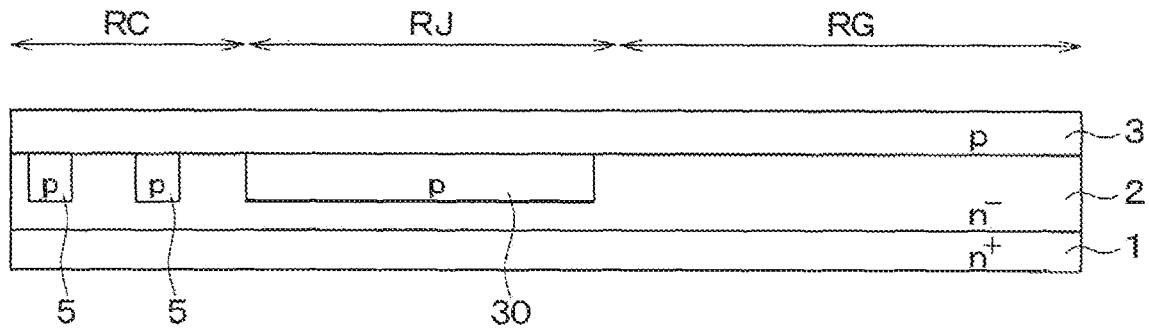
FIG. 6A is a cross-sectional view showing a process of manufacturing an SiC semiconductor device according to a third embodiment.
Figure 6B:
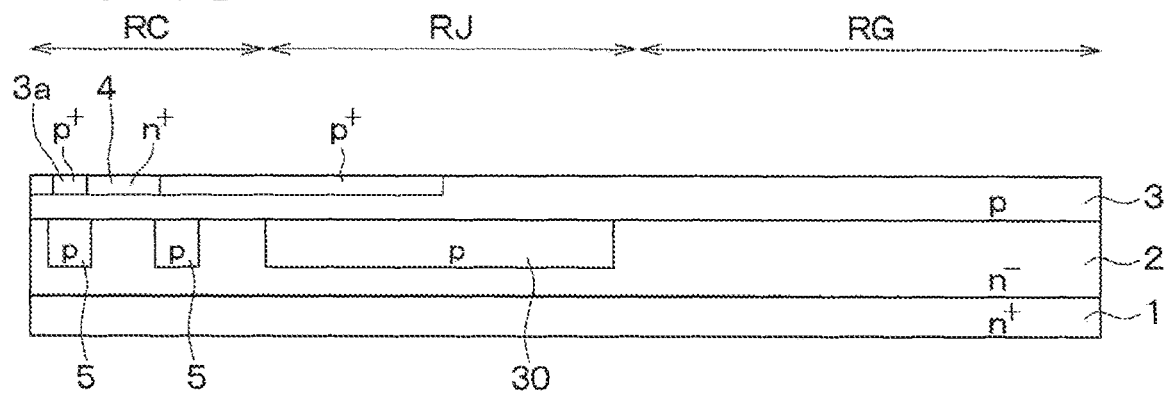
FIG. 6B is a cross-sectional view showing a process of manufacturing the SiC semiconductor device subsequent to the SiC semiconductor device of FIG. 6A.
Figure 6C:
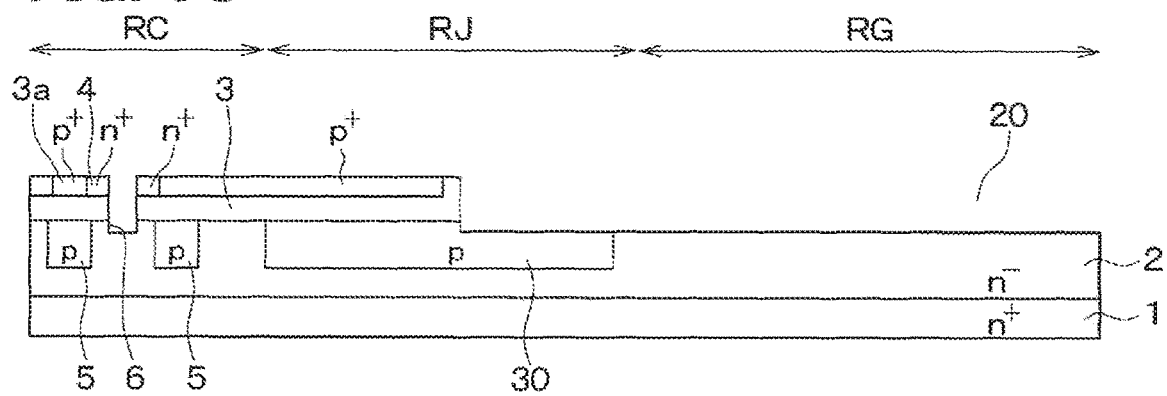
FIG. 6C is a cross-sectional view showing a process of manufacturing the SiC semiconductor device subsequent to the SiC semiconductor device of FIG. 6B.

Specifically, as a process shown in FIG. 6A, p-type guard rings 21 are not formed, and a p-type base region 3 is formed by performing the same process as that in FIG. 4D. Then, as a process shown in FIG. 6B, a process similar to the process shown in FIG. 4E is performed to form an n⁺-type source region 4 and a p-type contact region 3a. Further, as a process shown in FIG. 6C, a process similar to the process shown in FIG. 4F is performed to form gate trenches 6 and a recess portion 20.

Figure 6D:
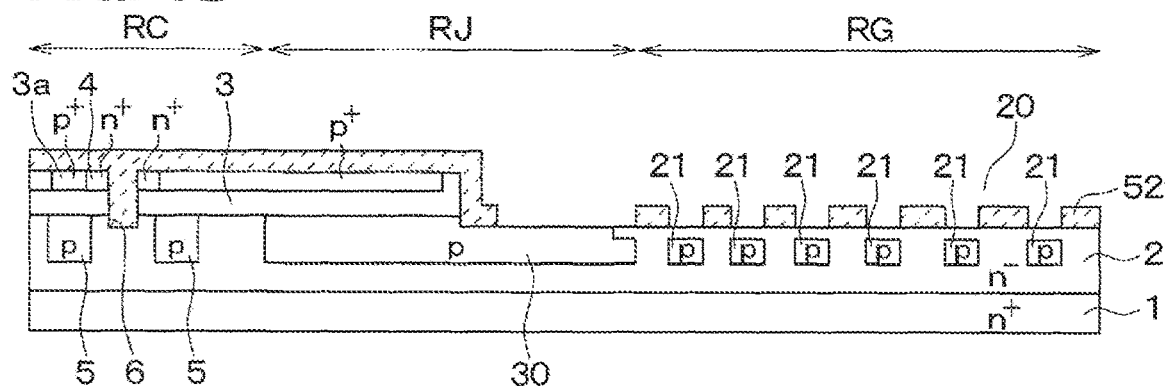
FIG. 6D is a cross-sectional view showing a process of manufacturing the SiC semiconductor device subsequent to the SiC semiconductor device of FIG. 6C.

Then, as a process shown in FIG. 6D, a mask 52 is disposed on the n⁻-type layer 2, and the mask 52 is opened in regions where the p-type deep layer 30 and the p-type guard rings 21 are to be formed. Then, p-type impurity ions are implanted into a bottom surface of the recess portion 20 by use of the mask 52. At this time, an ion implantation range is adjusted so that the p-type impurity is implanted at a position deeper than the surface of the n⁻-type layer 2 in the recess portion 20 by a predetermined depth, and the p-type impurity is not substantially implanted into the surface of the n⁻-type layer 2. As a result, the p-type guard rings 21 can be formed, and a portion of the p-type deep layer 30 on the p-type guard ring 21 side can be formed. Thereafter, the mask 52 is removed.

Similarly, in this example, not only the p-type guard rings 21 are formed, but also an end portion of the p-type deep layer 30 on the p-type guard ring 21 side is formed. As a result, as described in the second embodiment, a variation in the interval between the p-type deep layer 30 and the p-type guard rings 21 can be eliminated. However, similarly, in the manufacturing method according to the present embodiment, the intervals between the p-type deep layer 30 and the p-type guard rings 21 may vary within an allowable range, and therefore, only the p-type guard rings 21 may be formed in the process shown in FIG. 6D.

The subsequent processes are not illustrated, but the processes subsequent to the processes illustrated in FIG. 4G described in the first embodiment are then performed.

In this manner, a process of forming the p-type deep layers 5 and the p-type deep layer 30 which are formed up to the surface of the n⁻-type layer 2 may be performed before the formation of the recess portion 20, and a process of forming the p-type guard rings 21 which are formed only to positions away from the surface of the n⁻-type layer 2 may be performed after the formation of the recess portion 20.

Also, in this manner, the SiC semiconductor device having the structure shown in the first embodiment can be manufactured.

Fourth Embodiment

A fourth embodiment will be described. The present embodiment has a structure including a current dispersion layer as compared with the first embodiment, and the others are the same as those of the first embodiment, and therefore, only portions different from those of the first embodiment will be described.

Figure 7:
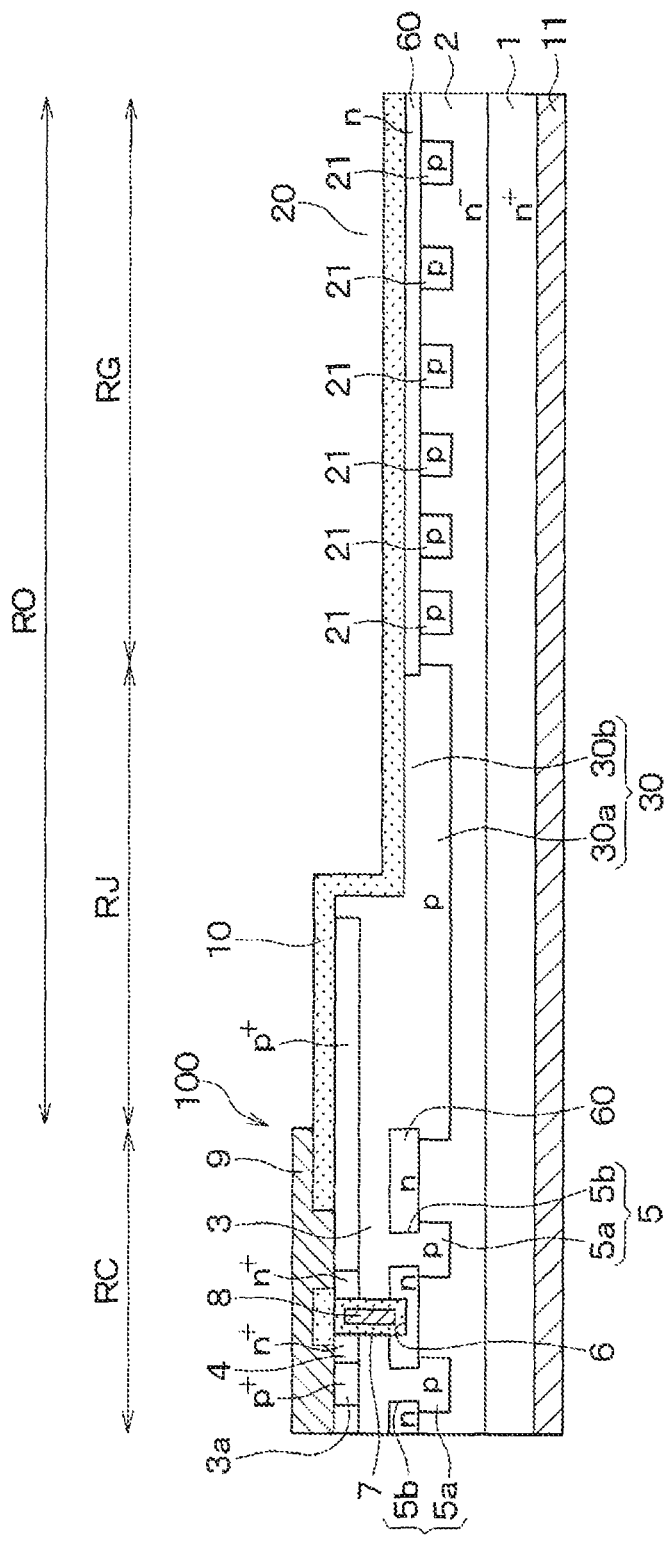
FIG. 7 is a cross-sectional view of an SiC semiconductor device according to a fourth embodiment.

As shown in FIG. 7, an SiC semiconductor device according to the present embodiment includes an n-type current dispersion layer 60, and a p-type base region 3 is formed on an n⁻-type layer 2 through the current dispersion layer 60. In other words, in the present embodiment, at a position of a depth corresponding to upper portions 5b of p-type deep layers 5 or an upper portion 30b of a p-type deep layer 30, a portion including no p-type deep layers 5 and no p-type deep layer 30 is formed with the current dispersion layer 60. Spaces between p-type guard rings 21 and an interlayer insulation film 10 are also formed by the current dispersion layer 60. For example, the current dispersion layer 60 has an n-type impurity concentration of $2.0 \times 10^{16}$ to $5.0 \times 10^{17}/cm^3$, and a thickness of 0.5 to 0.9 μm. However, since a part of an outer peripheral region RO is removed when a recess portion 20 is provided as will be described later, the thickness of the outer peripheral region RO is set to 0.2 to 0.6 μm.

The current dispersion layer 60 is a layer having the n-type impurity concentration higher than that of n⁻-type layer 2, that is, the current dispersion layer 60 has a low resistivity. When the n-type current dispersion layer 60 is provided, the current can be dispersed to flow in a wider range in the current dispersion layer 60, and a JFET resistance can be reduced.

As described above, the p-type base region 3 may be formed over the n⁻-type layer 2 across the current dispersion layer 60. In the structure having the current dispersion layer 60 as described above, the n⁻-type layer 2 and the current dispersion layer 60 configure an n-type layer serving as a drift layer, and the n⁻-type layer 2 configures a first layer and the current dispersion layer 60 configures a second layer.

Figure 8:
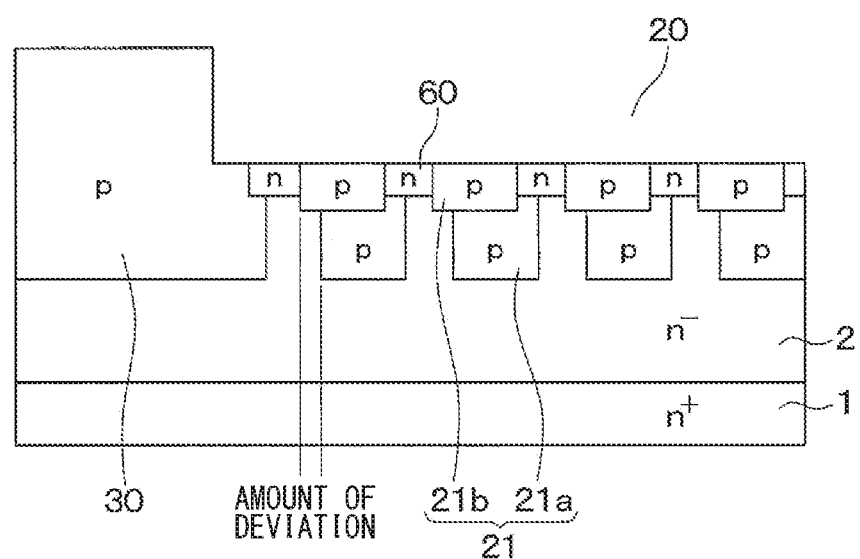
FIG. 8 is a cross-sectional view showing a state in which a deviation occurs in a formation position of the p-type guard ring.

When the current dispersion layer 60 is formed, ions are implanted into the current dispersion layer 60 to form upper portions 5b and 30b of the p-type deep layers 5 and the p-type deep layer 30. At this time, it is considered that ions are also implanted into portions of the current dispersion layer 60 corresponding to the p-type guard rings 21. However, in this case, since the p-type guard rings 21 are structured to be in contact with the interlayer insulation film 10 as described above, there is a risk that a creeping breakdown occurs. Further, as shown in FIG. 8, the process of forming the lower portions 21a of the p-type guard rings 21, which are formed in the surface layer portion of the n⁻-type layer 2 and the process of forming the upper portions 21b of the p-type guard rings 21, which are formed in the current dispersion layer 60, are separated from each other. For that reason, the formation positions of the upper portions 21b and the lower portions 21a may be deviated by the mask deviation at the time of forming the upper portions 21b and the lower portions 21a. As a result, the interval between the adjacent p-type guard rings 21 is narrowed, and if the amount of deviation is large, an electric field relaxation function of the p-type guard rings 21 cannot be exhibited, resulting in a case that a withstand voltage in the outer peripheral region RO cannot be obtained.

However, if the p-type guard rings 21 are formed only on the surface layer portion of the n⁻-type layer 2 and are not formed on the current dispersion layer 60 as in the present embodiment, the masking deviation cannot occur. For that reason, the interval between the adjacent p-type guard rings 21 can be set to a desired value, and the electric field relaxation effect by the p-type guard rings 21 can be exhibited, thereby making it possible to secure the withstand voltage in the outer peripheral region RO.

Figure 9:
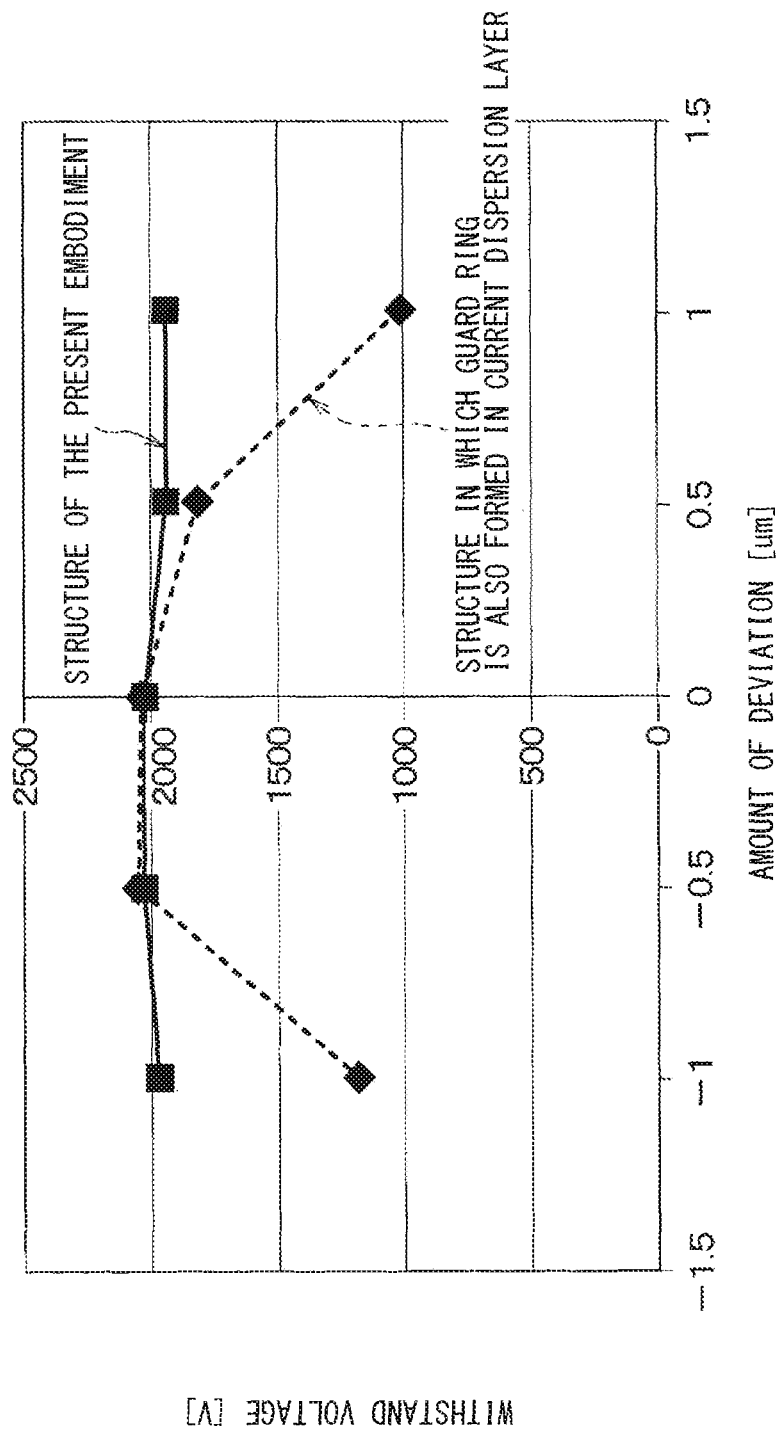
FIG. 9 is a diagram showing a change in breakdown voltage with respect to a deviation amount of the formation position of the p-type guard ring.

Specifically, as shown in FIG. 9, in the case of the structure in which the p-type guard rings 21 shown in FIG. 8 are also formed in the current dispersion layer 60, the withstand voltage changes in accordance with the amount of deviation between the lower portions 21a and the upper portions 21b due to the mask deviation, and the withstand voltage drops drastically when the amount of deviation increases. On the other hand, when the p-type guard rings 21 and the interlayer insulation film 10 are separated from each other in such a manner that the p-type guard rings 21 are not formed in the current dispersion layer 60 as in the present embodiment, the breakdown voltage hardly decreases even if the mask deviation occurs. In this manner, with the structure of the present embodiment, the withstand voltage in the outer peripheral region RO can be ensured.

Next, the method of manufacturing the SiC semiconductor device according to the present embodiment will be described with reference to the method of manufacturing the SiC semiconductor device according to the first embodiment described above.

First, as in the process shown in FIG. 4A described in the first embodiment, a semiconductor substrate obtained by epitaxially growing an n⁻-type layer 2 made of SiC on a main surface of an n⁺-type substrate 1 is prepared as a semiconductor substrate.

Figure 10A:
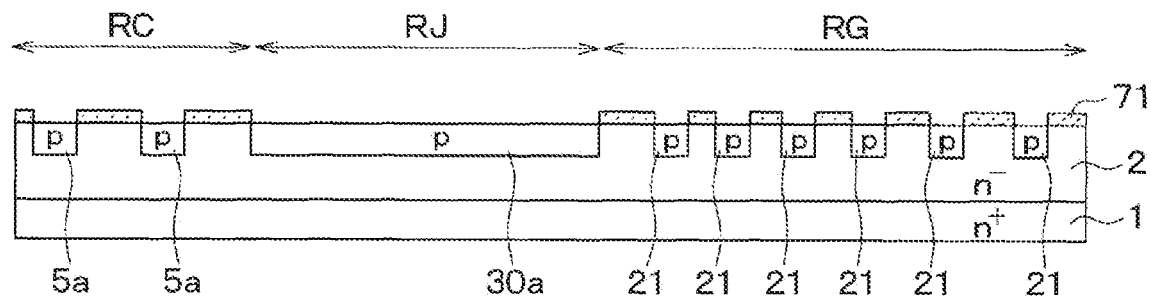
FIG. 10A is a cross-sectional view showing a process of manufacturing the SiC semiconductor device shown in FIG. 7.
Figure 10B:
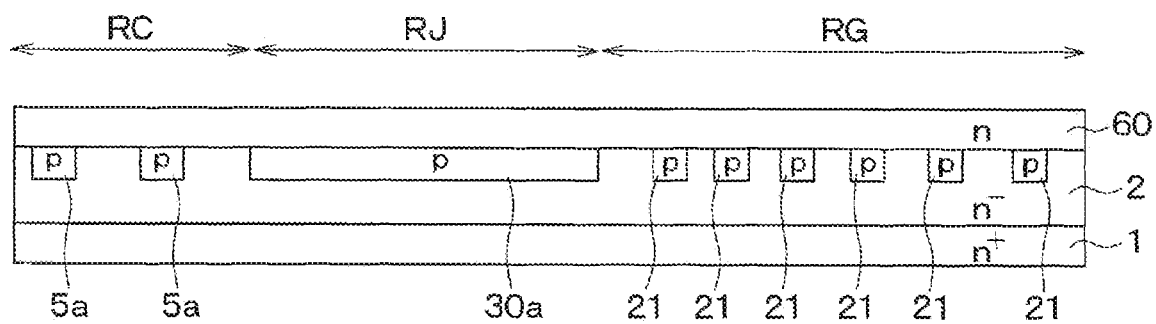
FIG. 10B is a cross-sectional view showing a process of manufacturing the SiC semiconductor device continued from FIG. 10A.
Figure 10C:
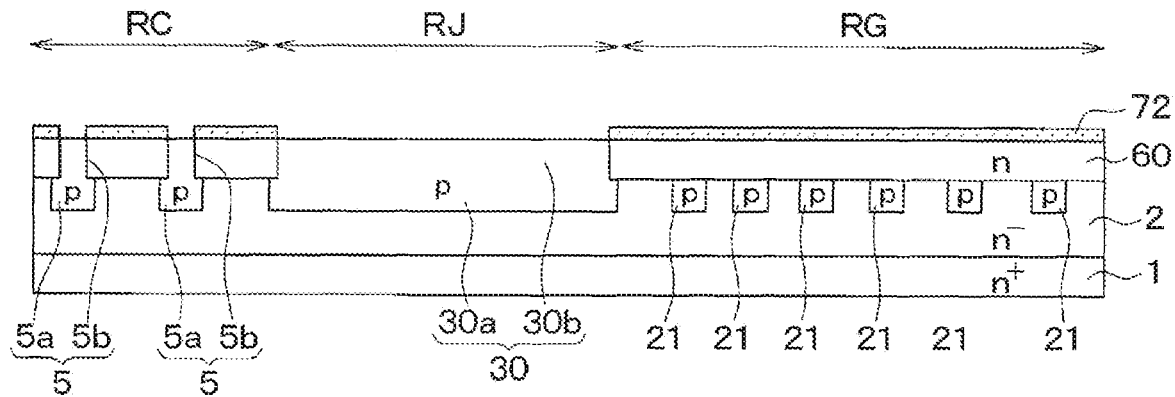
FIG. 10C is a cross-sectional view showing a process of manufacturing the SiC semiconductor device continued from FIG. 10B.

Then, the processes shown in FIGS. 10A to 10C are performed.

(Process Shown in FIG. 10A)

A mask 71 is disposed on the n⁻-type layer 2, and the mask 71 is opened in regions where p-type deep layers 5, a p-type deep layer 30, and p-type guard rings 21 are to be formed. Then, p-type impurity ions are implanted by use of the mask 71. As a result, the lower portion 5a of the p-type deep layer 5 and the lower portion 30a of the p-type deep layer 30 are formed to positions at a predetermined depth from the surface of the n⁻-type layer 2, and at the same time, the p-type guard rings 21 are formed.

Thereafter, the mask 71 is removed.

(Process Shown in FIG. 10B)

Next, the n-type current dispersion layer 60 having, for example, the n-type impurity concentration of $2.0 \times 10^{16}$ to $5.0 \times 10^{17}/cm^3$ and the thickness of 0.5 to 0.9 μm, is epitaxially grown on the n⁻-type layer 2 including the p-type deep layers 5, the p-type deep layer 30, and the p-type guard rings 21.

(Process Shown in FIG. 10C)

A mask 72 is disposed on the current dispersion layer 60, and the mask 72 is opened in regions where the p-type deep layers 5 and the p-type deep layer 30 are to be formed. Then, p-type impurity ions are implanted by use of the mask 72. As a result, the p-type deep layers 5 and the p-type deep layer 30 are formed. Thereafter, the mask 72 is removed.

The subsequent processes are not shown, but the processes shown in FIGS. 4C to 4E described in the first embodiment are first performed. As a result, the p-type base region 3, the n⁺-type source region 4, and the p-type contact region 3a are formed, and the gate trenches 6 and the recess portion 20 are formed. At this time, when the gate trenches 6 and the recess portion 20 are formed, the surface layer portion of the current dispersion layer 60 is etched by about 0.3 μm so as to penetrate through the p-type base region 3 and reach the current dispersion layer 60. For that reason, the thickness of the current dispersion layer 60 is set to 0.2 to 0.6 μm in the inside of the recess portion 20 and below the gate trenches 6. However, the amount of etching is adjusted so that the current dispersion layer 60 is not excessively removed.

Thereafter, the SiC semiconductor device according to the present embodiment can be manufactured by performing the processes after the process shown in FIG. 4F described in the first embodiment.

Other Embodiments

Although the present disclosure has been described in accordance with the embodiments described above, the present disclosure is not limited to the embodiments described above, and encompasses various modifications and variations within the scope of equivalents. In addition, various combinations and configurations, as well as other combinations and configurations that include only one element, more, or less, fall within the scope and spirit of the present disclosure.

For example, in the embodiments described above, the MOSFET 100 is exemplified as a semiconductor element included in the cell region RC of the SiC semiconductor device. However, even if another semiconductor device is formed, the p-type guard ring 21 in the outer peripheral region RO may have a structure that is out of contact with the interlayer insulation film 10. Examples of the semiconductor device described above may include Schottky Diodes and IGBTs. In each of the embodiments described above, an n-channel type MOSFET 100 in which the first conductivity type is an n-type and the second conductivity type is a p-type is exemplified, but a p-channel type MOSFET 100 in which the conductivity type of each component is inverted may be used. Further, the present disclosure is not limited to the element having the trench gate structure, and may be a planar element. The IGBT only changes the conductivity type of the n⁺-type substrate 1 from the n-type to the p-type in each of the embodiments described above, and the structure and manufacturing method of the IGBT are the same as in each of the embodiments described above.

In each of the embodiments described above, the interval between the p-type guard rings 21 may be kept constant, and the width of each p-type guard ring 21 may be wider toward the outer periphery.

In each of the embodiments described above, the method of forming the p-type deep layer 5, the p-type deep layer 30, and the p-type guard ring 21 is not limited to ion implantation, and may be another method, for example, epitaxial growth.

In the second embodiment, the lower portions 5a and 30a of the p-type deep layer 5 and the p-type deep layer 30, and the p-type guard ring 21 are formed to reach a position of a predetermined depth from the surface of the n⁻-type layer 2, but may be formed only to a position away from the surface of the n⁻-type layer 2. In this instance, in a process shown in FIG. 10C, when the upper portions 5b and 30b of the p-type deep layer 5 and the p-type deep layer 30 are formed, the p-type impurity is also implanted into the surface layer portion of n⁻-type layer 2. The upper portions 5b and 30b and the lower portions 5a and 30a of the p-type deep layer 5 and the p-type deep layer 30 may be connected to each other.

In the embodiments described above, the case in which SiC is used as the semiconductor material has been described, but the present disclosure can also be applied to a semiconductor device using other semiconductor materials such as Si.

It should be noted that if the orientation of the crystal is to be indicated, a bar (-) should originally be attached above a desired number, but since there are restrictions on the representation based on the electronic application, the bar is attached before the desired number in the present specification.

While various embodiments, configurations, and aspects of semiconductor device and manufacturing process according to the present disclosure have been exemplified, the embodiments, configurations, and aspects of the present disclosure are not limited to those described above. For example, embodiments, configurations, and aspects obtained from an appropriate combination of technical elements disclosed in different embodiments, configurations, and aspects are also included within the scope of the embodiments, configurations, and aspects of the present disclosure.

What is claimed is:

1. A semiconductor device comprising:
   a cell region that includes a semiconductor element;
   an outer peripheral region that surrounds an outer periphery of the cell region;
   a substrate that has a front surface and a back surface, and is made of a semiconductor of a first or second conductivity type;
   a first conductivity layer that is formed on the front surface of the substrate and made of the semiconductor of the first conductivity type having a lower impurity concentration than impurity concentration of the substrate;
   a first electrode that is provided on an opposite side of the substrate across the first conductivity layer, the first electrode being provided in the semiconductor element; and
   a second electrode that is placed toward the back surface of the substrate, the second electrode being provided in the semiconductor element,
   wherein:
   the outer peripheral region includes a plurality of second conductivity guard rings that is placed away from a surface of the first conductivity layer in a surface layer portion of the first conductivity layer, each second conductivity guard rings having frame-shaped line-like structure and surrounding the cell region;
   the outer peripheral region further includes an interlayer insulation film placed on the surface of the first conductivity layer; and
   the first conductivity layer includes
      a first layer placed on the front surface of the substrate and having the guard rings placed in the surface layer portion, and
      a second layer placed on the guard rings and the first layer and having a first conductivity impurity concentration higher than a first conductivity impurity concentration of the first layer.

2. The semiconductor device according to claim 1, wherein
   the semiconductor element is a MOSFET,
   the MOSFET includes:
      a base region of a second conductivity type that is placed on the second layer;
      a source region of a first conductivity type that is placed on the base region and has a first conductivity type impurity concentration higher than a first conductivity type impurity concentration of the first layer;
      a trench gate structure that includes, in a gate trench provided deeper than the base region from a surface of the source region, a gate insulation film covering an inner wall surface of the gate trench and a gate electrode disposed on the gate insulation film;
      the interlayer insulation film that covers the gate electrode and the gate insulation film, and has a contact hole;
      a source electrode that is the first electrode, and is electrically connected to the source region and the base region through the contact hole; and
      a drain electrode that is the second electrode, and is placed toward the back surface of the substrate, and
   the second layer forms a current dispersion layer.

3. A method for manufacturing a semiconductor device having a cell region in which a semiconductor element is formed, and an outer peripheral region surrounding an outer periphery of the cell region, the method comprising:
   forming, on a substrate having a front surface and a back surface and being made of a semiconductor of a first or second conductivity type, a first conductivity layer that is made of a semiconductor of a first conductivity type having a lower impurity concentration than impurity concentration of the substrate;
   forming a base region made of a semiconductor of a second conductivity type on the first conductivity layer;
   forming a source region made of a semiconductor of a first conductivity type having a first conductivity type impurity concentration higher than a first conductivity type impurity concentration of the first conductivity layer on the base region;
   forming a trench gate structure by providing a gate trench that reaches the first conductivity layer through the base region from a surface of the source region in the cell region, forming a gate insulation film in the gate trench, and forming a gate electrode on the gate insulation film;
   forming a recess portion that penetrates through the source region and the base region to reach the first conductivity layer in the outer peripheral region;
   forming an interlayer insulation film that covers the trench gate structure, the source region, the base region, and an inside of the recess portion;
   forming a contact hole in the interlayer insulation film in the cell region and then forming a source electrode that is electrically connected to the source region and the base region through the contact hole;
   forming a drain electrode toward the back surface of the substrate;
   forming a deep layer of a second conductivity type that reaches a surface of the first conductivity layer by implanting a second conductivity type impurity ion into the first conductivity layer in the cell region before the forming of the base region; and
   forming a guard ring having a frame-shaped line-like structure that surrounds the cell region at a depth away from the surface of the first conductivity layer by implanting a second conductivity type impurity ion into the first conductivity layer in the outer peripheral region before the forming of the base region,
   wherein,
   the forming of the deep layer includes:
      implanting a second conductivity type impurity ion into the first conductivity layer at a depth away from the surface of the first conductivity layer to form a lower portion of the deep layer concurrently when forming the guard ring; and implanting a second conductivity type impurity ion into the first conductivity layer to form an upper portion of the deep layer connected to the lower portion and reaching the surface of the first conductivity layer.

4. A method for manufacturing a semiconductor device having a cell region in which a semiconductor element is formed, and an outer peripheral region surrounding an outer periphery of the cell region, the method comprising:

forming, on a substrate having a front surface and a back surface and being made of a semiconductor of a first or second conductivity type, a first conductivity layer that is made of a semiconductor of a first conductivity type having a lower impurity concentration than impurity concentration of the substrate;

forming a base region made of a semiconductor of a second conductivity type on the first conductivity layer;

forming a source region made of a semiconductor of a first conductivity type having a first conductivity type impurity concentration higher than a first conductivity type impurity concentration of the first conductivity layer on the base region;

forming a trench gate structure by providing a gate trench that reaches the first conductivity layer through the base region from a surface of the source region in the cell region, forming a gate insulation film in the gate trench, and forming a gate electrode on the gate insulation film;

forming a recess portion that penetrates through the source region and the base region to reach the first conductivity layer in the outer peripheral region;

forming an interlayer insulation film that covers the trench gate structure, the source region, the base region, and an inside of the recess portion;

forming a contact hole in the interlayer insulation film in the cell region and then forming a source electrode that is electrically connected to the source region and the base region through the contact hole;

forming a drain electrode toward the back surface of the substrate;

forming a deep layer of a second conductivity type that reaches a surface of the first conductivity layer by implanting a second conductivity type impurity ion into the first conductivity layer in the cell region before the forming of the base region; and forming a guard ring having a frame-shaped line-like structure that surrounds the cell region at a depth away from the surface of the first conductivity layer by implanting a second conductivity type impurity ion into the first conductivity layer in the outer peripheral region before the forming of the base region, wherein, the forming of the first conductivity layer includes forming a first layer formed on the front surface of the substrate as the first conductivity layer, and forming a second layer having a first conductivity type impurity concentration higher than a first conductivity type impurity concentration of the first layer on a surface of the first layer.

5. A method for manufacturing a semiconductor device having a cell region in which a semiconductor element is formed, and an outer peripheral region surrounding an outer periphery of the cell region, the method comprising:

forming, on a substrate having a front surface and a back surface and being made of a semiconductor of a first or second conductivity type, a first conductivity layer that is made of a semiconductor of a first conductivity type having a lower impurity concentration than impurity concentration of the substrate;

forming a base region made of a semiconductor of a second conductivity type on the first conductivity layer;

forming a source region made of a semiconductor of a first conductivity type having a first conductivity type impurity concentration higher than a first conductivity type impurity concentration of the first conductivity layer on the base region;

forming a trench gate structure by providing a gate trench that reaches the first conductivity layer through the base region from a surface of the source region in the cell region, forming a gate insulation film in the gate trench, and forming a gate electrode on the gate insulation film;

forming a recess portion that penetrates through the source region and the base region to reach the first conductivity layer in the outer peripheral region;

forming an interlayer insulation film that covers the trench gate structure, the source region, the base region, and an inside of the recess portion;

forming a contact hole in the interlayer insulation film in the cell region and then forming a source electrode that is electrically connected to the source region and the base region through the contact hole;

forming a drain electrode toward the back surface of the substrate;

forming a deep layer of a second conductivity type that reaches a surface of the first conductivity layer by implanting a second conductivity type impurity ion into the first conductivity layer in the cell region before the forming of the base region; and forming a guard ring having a frame-shaped line-like structure that surrounds the cell region at a depth away from the surface of the first conductivity layer by implanting a second conductivity type impurity ion into the first conductivity layer in the outer peripheral region before the forming of the base region, wherein, the forming of the first conductivity layer includes forming a first layer formed on the front surface of the substrate as the first conductivity layer, and forming a second layer having a first conductivity type impurity concentration higher than a first conductivity type impurity concentration of the first layer on a surface of the first layer, and the forming of the deep layer further includes:

implanting a second conductivity type impurity ion into the first layer before the forming of the second layer to form a lower portion of the deep layer concurrently when forming the guard ring; and implanting a second conductivity type impurity ion into the second layer after the forming of the second layer to form an upper portion of the deep layer connected to the lower portion.

6. The method for manufacturing the semiconductor device according to claim 3, wherein the deep layer formed in the cell region is defined as a first deep layer, the method further comprises forming a second deep layer of a second conductivity type in a surface layer portion of the first conductivity layer by implanting a second conductivity type impurity ion in a connection portion located in the outer peripheral region between the cell region and a guard ring portion in which the guard ring is formed, and the forming of the second deep layer includes:

forming a lower portion of the second deep layer concurrently when forming a lower portion of the first deep layer and the guard ring; and forming an upper portion of the second deep layer concurrently when forming an upper portion of the first deep layer.

7. A method for manufacturing the semiconductor device having a cell region in which a semiconductor element is formed, and an outer peripheral region surrounding an outer periphery of the cell region, the method comprising:

forming, on a substrate having a front surface and a back surface and made of a semiconductor of a first or second conductivity type, a first conductivity layer that is made of a semiconductor of a first conductivity type having a lower impurity concentration than impurity concentration of the substrate;

forming a base region that is made of a semiconductor of a second conductivity type on the first conductivity layer, forming a source region that is made of a semiconductor of a first conductivity type having a first conductivity type impurity concentration higher than a first conductivity type impurity concentration of the first conductivity layer on the base region;

forming a trench gate structure by forming a gate trench that reaches the first conductivity layer through the base region from a surface of the source region in the cell region, and then forming a gate insulation film in the gate trench and a gate electrode on the gate insulation film;

forming a recess portion that penetrates through the source region and the base region to reach the first conductivity layer in the outer peripheral region;

forming an interlayer insulation film that covers the trench gate structure, the source region, the base region, and an inside of the recess portion;

forming a contact hole in the interlayer insulation film in the cell region;

forming a source electrode that is electrically connected to the source region and the base region through the contact hole after;

forming a drain electrode toward the back surface of the substrate;

forming a deep layer of a second conductivity type that reaches a surface of the first conductivity layer by implanting a second conductivity type impurity ion into the first conductivity layer in the cell region before the forming of the base region; and forming a guard ring having a frame-shaped line-like structure that surrounds the cell region by implanting a second conductivity type impurity ion into the first conductivity layer at a depth away from the surface of the first conductivity layer in the outer peripheral region after the forming of the recess portion, wherein, the deep layer formed in the cell region is defined as a first deep layer, the method further comprises forming a second deep layer of a second conductivity type in a surface layer portion of the first conductivity layer by implanting a second conductivity type impurity ion in a connection portion located in the outer peripheral region between the cell region and a guard ring portion in which the guard ring is formed, and the forming of the second deep layer includes forming a least a part of the second deep layer concurrently when forming the first deep layer.

8. The method for manufacturing the semiconductor device according to claim 7, wherein the forming of the second deep layer includes forming an end portion of the second deep layer on the guard ring side concurrently when forming the guard ring.

* * * * *